(12) United States Patent
Li

(10) Patent No.: US 9,381,825 B2
(45) Date of Patent: *Jul. 5, 2016

(54) STATE OF CHARGE QUALITY BASED CELL BALANCING CONTROL

(71) Applicant: Ford Global Technologies, LLC, Dearborn, MI (US)

(72) Inventor: Yonghua Li, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 168 days.

This patent is subject to a terminal disclaimer.

(21) Appl. No.: 14/184,802

(22) Filed: Feb. 20, 2014

(65) Prior Publication Data

US 2015/0231985 A1 Aug. 20, 2015

(51) Int. Cl.
*H02J 7/00* (2006.01)
*B60L 11/18* (2006.01)
*G01R 31/36* (2006.01)

(52) U.S. Cl.
CPC ............. *B60L 11/1862* (2013.01); *G01R 31/36* (2013.01); *H02J 7/0016* (2013.01); *H02J 7/0019* (2013.01); *H02J 7/0026* (2013.01); *Y02T 10/7005* (2013.01)

(58) Field of Classification Search
CPC ..... H02J 7/0026; H02J 7/0019; H02J 7/0016; B60L 11/1862; G01R 31/36; Y02T 10/7005
See application file for complete search history.

(56) References Cited

U.S. PATENT DOCUMENTS

| 5,404,106 A | 4/1995 | Matsuda |
| 6,114,835 A | 9/2000 | Price |
| 6,232,744 B1 | 5/2001 | Kawai et al. |
| 7,358,704 B2 * | 4/2008 | Yumoto ............. G01R 31/3651 320/119 |
| 7,525,285 B2 * | 4/2009 | Plett ...................... H02J 7/0014 320/132 |
| 8,008,891 B2 * | 8/2011 | Yun ..................... B60L 11/1861 320/132 |
| 8,084,996 B2 | 12/2011 | Zhang et al. |
| 8,108,161 B2 * | 1/2012 | Tomura .............. G01R 31/3624 320/132 |

(Continued)

FOREIGN PATENT DOCUMENTS

| EP | 2551687 A1 | 1/2013 |
| WO | 2013016188 A1 | 1/2013 |

OTHER PUBLICATIONS

Habiballh Rahimi-Eichi and Mo-Yuen Chow, Adaptive Online Battery Parameters/SOC/Capacity Co-estimation, Transportation Electrification Conference and Expo (ITEC), 2013 IEEE, Jun. 16, 2013.

*Primary Examiner* — Naum B Levin
(74) *Attorney, Agent, or Firm* — David Kelley; Brooks Kushman P.C.

(57) ABSTRACT

Hybrid-electric and pure electric vehicles include a traction battery comprised of many cells. During repeated charge and discharge cycles, the state of charge of the cells may vary from cell to cell. To optimize traction battery usage, it is desirable that the state of charge of the cells be equalized. Cell balancing can equalize the states of charge and improve battery performance. To achieve proper cell balancing, an accurate state of charge value should be known for each cell. An accurate state of charge value may be achieved when a persistent excitation condition and an estimation convergence condition are met. If the conditions are not met, active excitation of the battery may be performed to improve the chances of meeting the conditions. Cell balancing may be initiated and terminated according to state of charge values estimated when the conditions are satisfied.

19 Claims, 7 Drawing Sheets

(56) References Cited

U.S. PATENT DOCUMENTS

| | | |
|---|---|---|
| 8,279,074 B2 | 10/2012 | Fischer |
| 8,332,169 B2 | 12/2012 | Kang et al. |
| 8,336,651 B2 | 12/2012 | Nishi et al. |
| 8,880,321 B2 * | 11/2014 | Sun .................... G05B 13/042 701/103 |
| 9,026,347 B2 * | 5/2015 | Gadh ................ B60L 11/1842 320/109 |
| 9,108,524 B2 * | 8/2015 | Zhang ................ B60L 11/1861 |
| 2003/0146737 A1 * | 8/2003 | Kadouchi ............ H02J 7/0019 320/132 |
| 2009/0115376 A1 | 5/2009 | Takeuchi |
| 2010/0121588 A1 * | 5/2010 | Elder .................... H01M 10/48 702/63 |
| 2010/0138178 A1 | 6/2010 | Paryani et al. |
| 2010/0153038 A1 * | 6/2010 | Tomura ............. G01R 31/3624 702/63 |
| 2010/0318252 A1 | 12/2010 | Izumi |
| 2011/0298624 A1 | 12/2011 | Bauman et al. |
| 2012/0072145 A1 | 3/2012 | Zhang et al. |
| 2012/0105013 A1 | 5/2012 | Lin et al. |
| 2012/0136595 A1 | 5/2012 | Tang et al. |
| 2012/0239325 A1 | 9/2012 | Sunyi et al. |
| 2013/0013238 A1 | 1/2013 | Kawakita |
| 2013/0033102 A1 | 2/2013 | Goff et al. |
| 2013/0057198 A1 | 3/2013 | Gerlovin |
| 2013/0110428 A1 | 5/2013 | Sun et al. |
| 2013/0127399 A1 | 5/2013 | Tang et al. |
| 2013/0179061 A1 * | 7/2013 | Gadh .................. B60L 11/1842 701/123 |
| 2013/0278223 A1 * | 10/2013 | Li ........................ H01M 10/48 320/136 |
| 2014/0145670 A1 * | 5/2014 | van Zwam ............ H02J 7/0018 320/104 |
| 2014/0180614 A1 * | 6/2014 | Chaturvedi ........ G01R 31/3651 702/63 |
| 2014/0199569 A1 * | 7/2014 | Sisk ...................... B60L 3/0046 429/91 |
| 2014/0203813 A1 * | 7/2014 | Driemeyer-Franco G01R 31/3624 324/434 |
| 2014/0210418 A1 | 7/2014 | Wang et al. |
| 2014/0361743 A1 * | 12/2014 | Lin ..................... B60L 11/1864 320/109 |
| 2015/0064510 A1 * | 3/2015 | Wang .................... H01M 10/48 429/50 |
| 2015/0147608 A1 | 5/2015 | Lin et al. |
| 2015/0231982 A1 * | 8/2015 | Li ............................ B60L 1/003 701/22 |
| 2015/0231986 A1 * | 8/2015 | Li ............................. B60L 3/12 701/22 |
| 2015/0232083 A1 * | 8/2015 | Yu ...................... B60W 20/106 701/22 |

* cited by examiner

STATE OF CHARGE QUALITY BASED CELL BALANCING CONTROL

TECHNICAL FIELD

This application is generally related to traction battery cell balancing.

BACKGROUND

Hybrid-electric and pure electric vehicles rely on a traction battery to provide power for propulsion. To ensure optimal operation of the vehicle, various properties of the traction battery may be monitored. One useful property is the battery power capability which indicates how much power the battery may supply or absorb at a given time. Another useful property is the battery state of charge which indicates the amount of charge stored in the battery. The battery properties are important for controlling operation of the battery during charging/discharging, maintaining the battery within safe operating limits, and balancing cells of the battery.

Battery properties may be measured directly or indirectly. Battery voltages and currents may be measured directly using sensors. Other battery properties may require that one or more parameters of the battery be estimated first. The estimated parameters may include resistances, capacitances, and voltages associated with the traction battery. The battery properties may then be calculated from the estimated battery parameters. Many prior art schemes are available for estimating the battery parameters, including implementing a Kalman filter model to recursively estimate the model parameters.

SUMMARY

A battery control system includes a traction battery including a plurality of cells and at least one controller. The controller is programmed to generate model parameter estimates for the cells and, in response to a magnitude of a state of charge difference between cells being greater than a predetermined value while a persistent excitation condition and an estimation convergence condition are satisfied, balance the cells according to states of charge derived from the model parameter estimates. The persistent excitation condition may be satisfied when $$\alpha_0 I \geq \frac{1}{T_{pe}} * \int_{t_0}^{t_0+T_{pe}} \left[ \frac{d(V_t(\tau) - V_{oc}(\tau))}{d\tau} i(\tau) \frac{di(\tau)}{d\tau} \right]^T *$$
$$\left[ \frac{d(V_t(\tau) - V_{oc}(\tau))}{d\tau} i(\tau) \frac{di(\tau)}{d\tau} \right] d\tau \geq \alpha_1 I$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values. The estimation convergence condition may be satisfied when an error magnitude between at least one of the model parameter estimates and a corresponding measured model parameter value is less than a predetermined threshold for a predetermined period of time. The at least one controller may be further programmed to, in response to at least one of the persistent excitation condition and the estimation convergence condition not being satisfied, cause a predetermined number of frequency component amplitudes of battery power demand to exceed a predetermined magnitude without affecting vehicle acceleration.

A vehicle includes a traction battery including a plurality of cells and at least one controller. The controller is programmed to, in response to a magnitude of a state of charge difference between cells being greater than a predetermined value while a persistent excitation condition and an estimation convergence condition are satisfied, balance the cells according to states of charge derived from estimated cell model parameters. The persistent excitation condition may be satisfied when $$\alpha_0 I \geq \frac{1}{T_{pe}} * \int_{t_0}^{t_0+T_{pe}} \left[ \frac{d(V_t(\tau) - V_{oc}(\tau))}{d\tau} i(\tau) \frac{di(\tau)}{d\tau} \right]^T *$$
$$\left[ \frac{d(V_t(\tau) - V_{oc}(\tau))}{d\tau} i(\tau) \frac{di(\tau)}{d\tau} \right] d\tau \geq \alpha_1 I$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values. The estimation convergence condition may be satisfied when an error magnitude between at least one estimated traction battery parameter and a corresponding measured traction battery parameter value is less than a predetermined threshold for a predetermined period of time. The controller may be further programmed to, in response to the magnitude of the state of charge difference between cells being less than the predetermined value, terminate balancing the cells. The controller may be further programmed to, in response to the magnitude of the state of charge difference between cells being less than the predetermined value after the persistent excitation condition and the estimation convergence condition have been satisfied during cell balancing, terminate balancing the cells. The controller may be further programmed to, in response to the persistent excitation condition and the estimation convergence condition not being satisfied for a predetermined period of time after starting cell balancing, cause a predetermined number of frequency component amplitudes of battery power demand to exceed a predetermined magnitude without affecting acceleration of the vehicle. The controller may be further programmed to balance the cells at a scheduled time in response to the magnitude of the state of charge difference between cells being greater than a predetermined value after the persistent excitation condition and the estimation convergence condition have been satisfied at the scheduled time. The controller may be further programmed to, in response to the persistent excitation condition and the estimation convergence condition not being satisfied at the scheduled time, cause a predetermined number of frequency component amplitudes of battery power demand to exceed a predetermined magnitude without affecting acceleration of the vehicle.

A method of balancing cells of a traction battery by at least one controller includes initiating, after learning a first set of states of charge for the cells in response to a persistent excitation condition and an estimation convergence condition being satisfied, cell balancing based on first state of charge differences between the cells having a magnitude greater than a predetermined value. The method further includes terminating, after learning a second set of states of charge for the cells in response to the persistent excitation condition and the estimation convergence condition being satisfied, cell balancing based on second state of charge differences between the cells having a magnitude less than the predetermined value. The persistent excitation condition may be satisfied when $$\alpha_0 I \geq \frac{1}{T_{pe}} * \int_{t_0}^{t_0+T_{pe}} \left[ \frac{d(V_t(\tau) - V_{oc}(\tau))}{d\tau} i(\tau) \frac{di(\tau)}{d\tau} \right]^T *$$

$$\left[ \frac{d(V_t(\tau) - V_{oc}(\tau))}{d\tau} i(\tau) \frac{di(\tau)}{d\tau} \right] d\tau \geq \alpha_1 I \quad (5)$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values. The estimation convergence condition may be satisfied when an error magnitude between an estimated model parameter and a corresponding measured model parameter value is less than a predetermined threshold for a predetermined period of time. The method may further include permitting cell balancing to be initiated at a predetermined time. The method may further include causing a predetermined number of frequency component amplitudes of battery power demand to exceed a predetermined magnitude without affecting vehicle acceleration in response to the persistent excitation condition and the estimation convergence condition not being satisfied within a predetermined time interval before the predetermined time. The method may further include causing a predetermined number of frequency component amplitudes of battery power demand to exceed a predetermined magnitude without affecting vehicle acceleration in response to cell balancing not terminating a predetermined amount of time after being initiated. The method may further include limiting a number of cell balancing cycles within a single ignition cycle to be less than a predetermined number of cycles.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Figure 1:
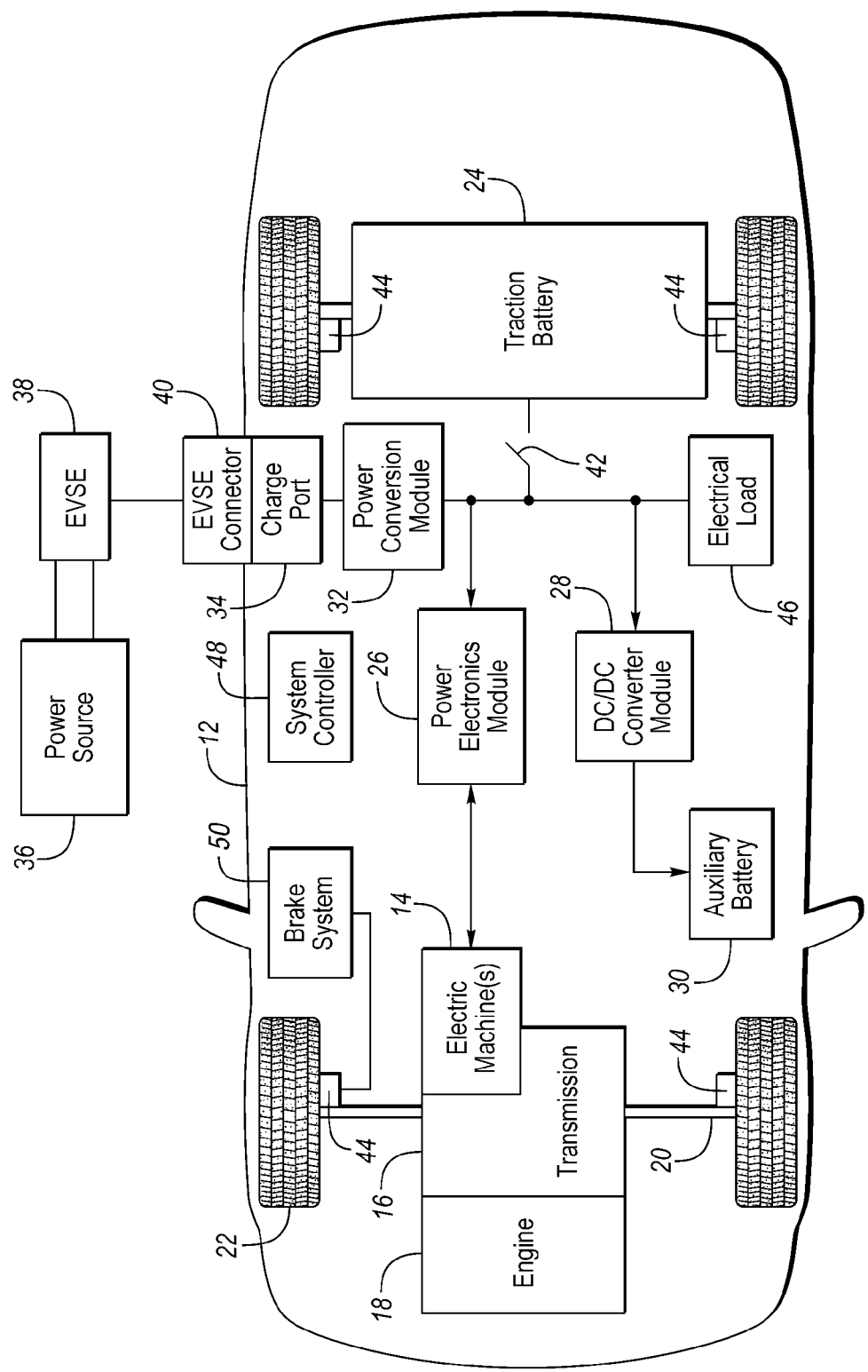
FIG. 1 is a diagram of a hybrid vehicle illustrating typical drivetrain and energy storage components.

FIG. 1 depicts a typical plug-in hybrid-electric vehicle (HEV). A typical plug-in hybrid-electric vehicle 12 may comprise one or more electric machines 14 mechanically connected to a hybrid transmission 16. The electric machines 14 may be capable of operating as a motor or a generator. In addition, the hybrid transmission 16 is mechanically connected to an engine 18. The hybrid transmission 16 is also mechanically connected to a drive shaft 20 that is mechanically connected to the wheels 22. The electric machines 14 can provide propulsion and deceleration capability when the engine 18 is turned on or off. The electric machines 14 also act as generators and can provide fuel economy benefits by recovering energy that would normally be lost as heat in the friction braking system. The electric machines 14 may also reduce vehicle emissions by allowing the engine 18 to operate at more efficient speeds and allowing the hybrid-electric vehicle 12 to be operated in electric mode with the engine 18 off under certain conditions.

A traction battery or battery pack 24 stores energy that can be used by the electric machines 14. A vehicle battery pack 24 typically provides a high voltage DC output. The traction battery 24 is electrically connected to one or more power electronics modules. One or more contactors 42 may isolate the traction battery 24 from other components when opened and connect the traction battery 24 to other components when closed. A power electronics module 26 is also electrically connected to the electric machines 14 and provides the ability to bi-directionally transfer energy between the traction battery 24 and the electric machines 14. For example, a typical traction battery 24 may provide a DC voltage while the electric machines 14 may require a three-phase AC current to function. The power electronics module 26 may convert the DC voltage to a three-phase AC current as required by the electric machines 14. In a regenerative mode, the power electronics module 26 may convert the three-phase AC current from the electric machines 14 acting as generators to the DC voltage required by the traction battery 24. The description herein is equally applicable to a pure electric vehicle. For a pure electric vehicle, the hybrid transmission 16 may be a gear box connected to an electric machine 14 and the engine 18 may not be present.

In addition to providing energy for propulsion, the traction battery 24 may provide energy for other vehicle electrical systems. A typical system may include a DC/DC converter module 28 that converts the high voltage DC output of the traction battery 24 to a low voltage DC supply that is compatible with other vehicle loads. Other high-voltage loads, such as compressors and electric heaters, may be connected directly to the high-voltage without the use of a DC/DC converter module 28. The low-voltage systems may be electrically connected to an auxiliary battery 30 (e.g., 12V battery).

The vehicle 12 may be an electric vehicle or a plug-in hybrid vehicle in which the traction battery 24 may be recharged by an external power source 36. The external power source 36 may be a connection to an electrical outlet. The external power source 36 may be electrically connected to electric vehicle supply equipment (EVSE) 38. The EVSE 38 may provide circuitry and controls to regulate and manage the transfer of energy between the power source 36 and the vehicle 12. The external power source 36 may provide DC or AC electric power to the EVSE 38. The EVSE 38 may have a charge connector 40 for plugging into a charge port 34 of the vehicle 12. The charge port 34 may be any type of port configured to transfer power from the EVSE 38 to the vehicle 12. The charge port 34 may be electrically connected to a charger or on-board power conversion module 32. The power conversion module 32 may condition the power supplied from the EVSE 38 to provide the proper voltage and current levels to the traction battery 24. The power conversion module 32 may interface with the EVSE 38 to coordinate the delivery of power to the vehicle 12. The EVSE connector 40 may have pins that mate with corresponding recesses of the charge port 34. Alternatively, various components described as being electrically connected may transfer power using a wireless inductive coupling.

One or more wheel brakes 44 may be provided for decelerating the vehicle 12 and preventing motion of the vehicle 12. The wheel brakes 44 may be hydraulically actuated, electrically actuated, or some combination thereof. The wheel brakes 44 may be a part of a brake system 50. The brake system 50 may include other components that are required to operate the wheel brakes 44. For simplicity, the figure depicts a single connection between the brake system 50 and one of the wheel brakes 44. A connection between the brake system 50 and the other wheel brakes 44 is implied. The brake system 50 may include a controller to monitor and coordinate the brake system 50. The brake system 50 may monitor the brake components and control the wheel brakes 44 to achieve desired operation. The brake system 50 may respond to driver commands and may also operate autonomously to implement features such as stability control. The controller of the brake system 50 may implement a method of applying a requested brake force when requested by another controller or sub-function.

One or more electrical loads 46 may be connected to the high-voltage bus. The electrical loads 46 may have an associated controller that operates the electrical load 46 when appropriate. Examples of electrical loads 46 may be a heating module or an air-conditioning module.

The various components discussed may have one or more associated controllers to control and monitor the operation of the components. The controllers may communicate via a serial bus (e.g., Controller Area Network (CAN)) or via discrete conductors. In addition, a system controller 48 may be present to coordinate the operation of the various components.

Figure 2:
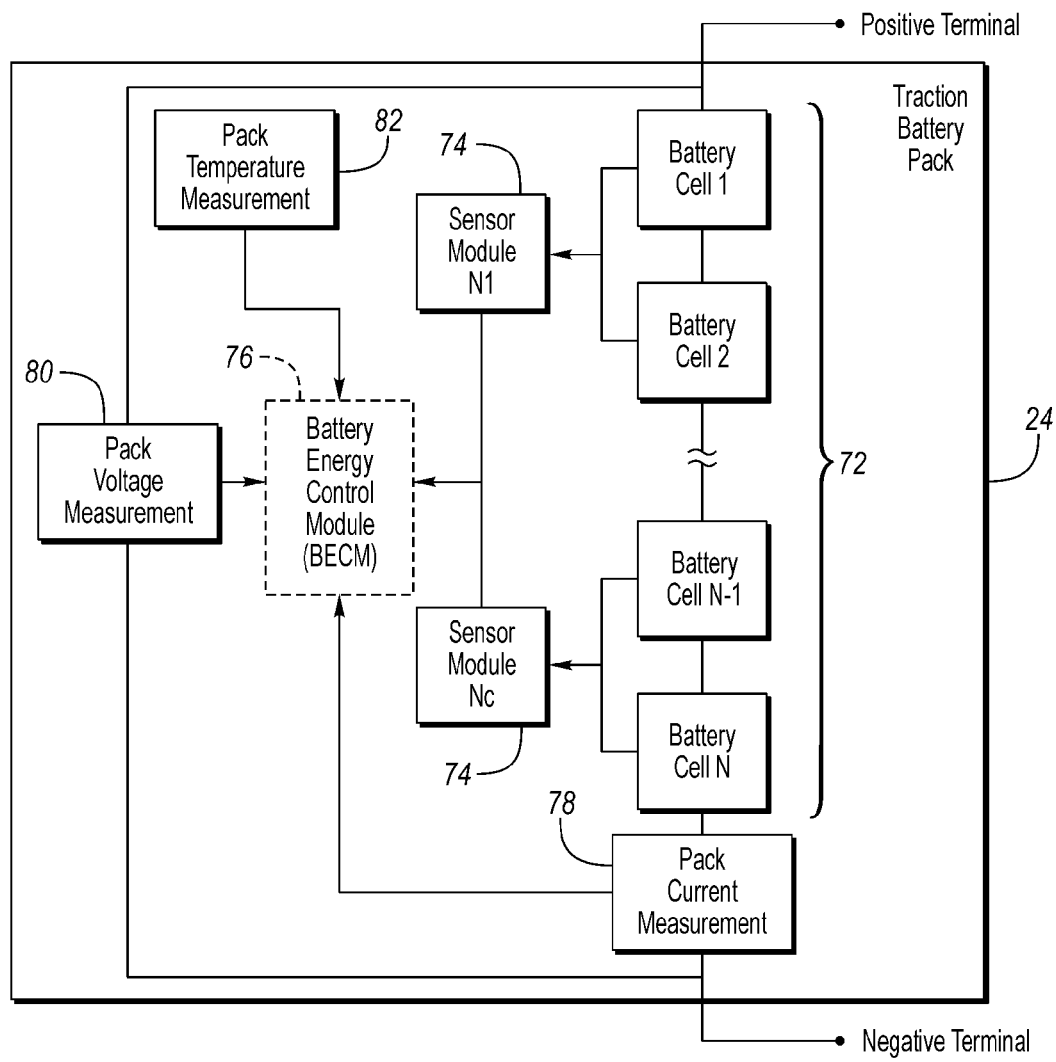
FIG. 2 is a diagram of a possible battery pack arrangement comprised of multiple cells, and monitored and controlled by a Battery Energy Control Module.

A traction battery 24 may be constructed from a variety of chemical formulations. Typical battery pack chemistries may be lead acid, nickel-metal hydride (NIMH) or Lithium-Ion. FIG. 2 shows a typical traction battery pack 24 in a simple series configuration of N battery cells 72. Other battery packs 24, however, may be composed of any number of individual battery cells connected in series or parallel or some combination thereof. A typical system may have one or more controllers, such as a Battery Energy Control Module (BECM) 76 that monitors and controls the performance of the traction battery 24. The BECM 76 may monitor several battery pack level characteristics such as pack current 78, pack voltage 80 and pack temperature 82. The BECM 76 may have non-volatile memory such that data may be retained when the BECM 76 is in an off condition. Retained data may be available upon the next key cycle.

In addition to the pack level characteristics, there may be battery cell 72 level characteristics that are measured and monitored. For example, the terminal voltage, current, and temperature of each cell 72 may be measured. A system may use a sensor module 74 to measure the battery cell 72 characteristics. Depending on the capabilities, the sensor module 74 may measure the characteristics of one or multiple of the battery cells 72. The battery pack 24 may utilize up to $N_c$ sensor modules 74 to measure the characteristics of all the battery cells 72. Each sensor module 74 may transfer the measurements to the BECM 76 for further processing and coordination. The sensor module 74 may transfer signals in analog or digital form to the BECM 76. In some embodiments, the sensor module 74 functionality may be incorporated internally to the BECM 76. That is, the sensor module 74 hardware may be integrated as part of the circuitry in the BECM 76 and the BECM 76 may handle the processing of raw signals.

It may be useful to calculate various characteristics of the battery pack. Quantities such a battery power capability and battery state of charge may be useful for controlling the operation of the battery pack as well as any electrical loads receiving power from the battery pack. Battery power capability is a measure of the maximum amount of power the battery can provide or the maximum amount of power that the battery can receive. Knowing the battery power capability allows electrical loads to be managed such that the power requested is within limits that the battery can handle.

Battery pack state of charge (SOC) gives an indication of how much charge remains in the battery pack. The battery pack SOC may be output to inform the driver of how much charge remains in the battery pack, similar to a fuel gauge. The battery pack SOC may also be used to control the operation of an electric or hybrid-electric vehicle. Calculation of battery pack SOC can be accomplished by a variety of methods. One possible method of calculating battery SOC is to perform an integration of the battery pack current over time. This is well-known in the art as ampere-hour integration. One possible disadvantage to this method is that the current measurement may be noisy. Possible inaccuracy in the state of charge may occur due to the integration of this noisy signal over time.

Figure 3:
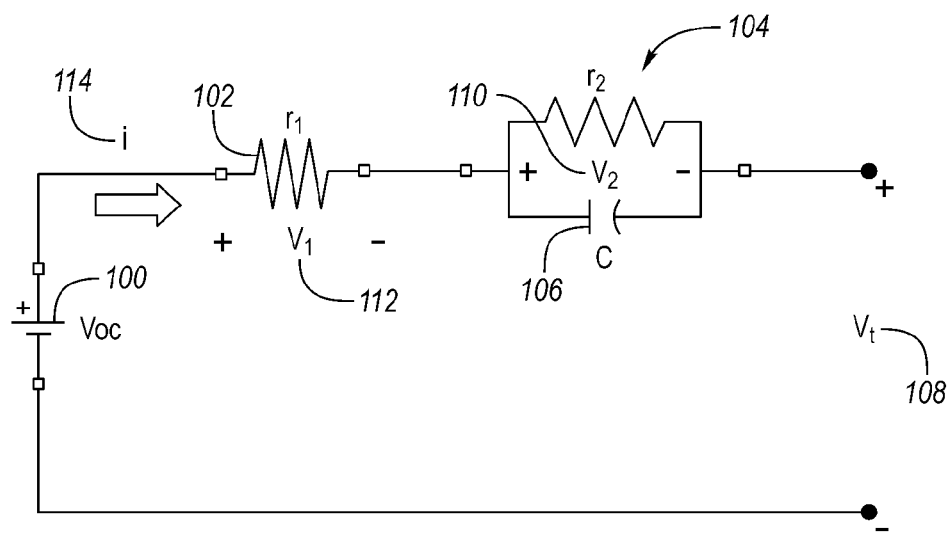
FIG. 3 is a diagram of an example battery cell equivalent circuit.

A battery cell may be modeled as a circuit. FIG. 3 shows one possible battery cell equivalent circuit model (ECM). A battery cell may be modeled as a voltage source ($V_{oc}$) 100 having associated resistances (102 and 104) and capacitance 106. $V_{oc}$ 100 represents the open-circuit voltage of the battery. The model includes an internal resistance, $r_1$ 102, a charge transfer resistance, $r_2$ 104, and a double layer capacitance, C 106. The voltage $V_1$ 112 is the voltage drop across the internal resistance 102 due to current 114 flowing through the circuit. The voltage $V_2$ 110 is the voltage drop across the parallel combination of $r_2$ and C due to current 114 flowing through the combination. The voltage $V_t$ 108 is the voltage across the terminals of the battery (terminal voltage).

Because of the battery cell impedance, the terminal voltage, $V_t$ 108, may not be the same as the open-circuit voltage, $V_{oc}$ 100. The open-circuit voltage, $V_{oc}$ 100, may not be readily measurable as only the terminal voltage 108 of the battery cell is accessible for measurement. When no current 114 is flowing for a sufficiently long period of time, the terminal voltage 108 may be the same as the open-circuit voltage 100. A sufficiently long period of time may be necessary to allow the internal dynamics of the battery to reach a steady state. When current 114 is flowing, $V_{oc}$ 100 may not be readily measurable and the value may need to be inferred based on the circuit model. The impedance parameter values, $r_1$, $r_2$, and C may be known or unknown. The value of the parameters may depend on the battery chemistry.

Figure 4:
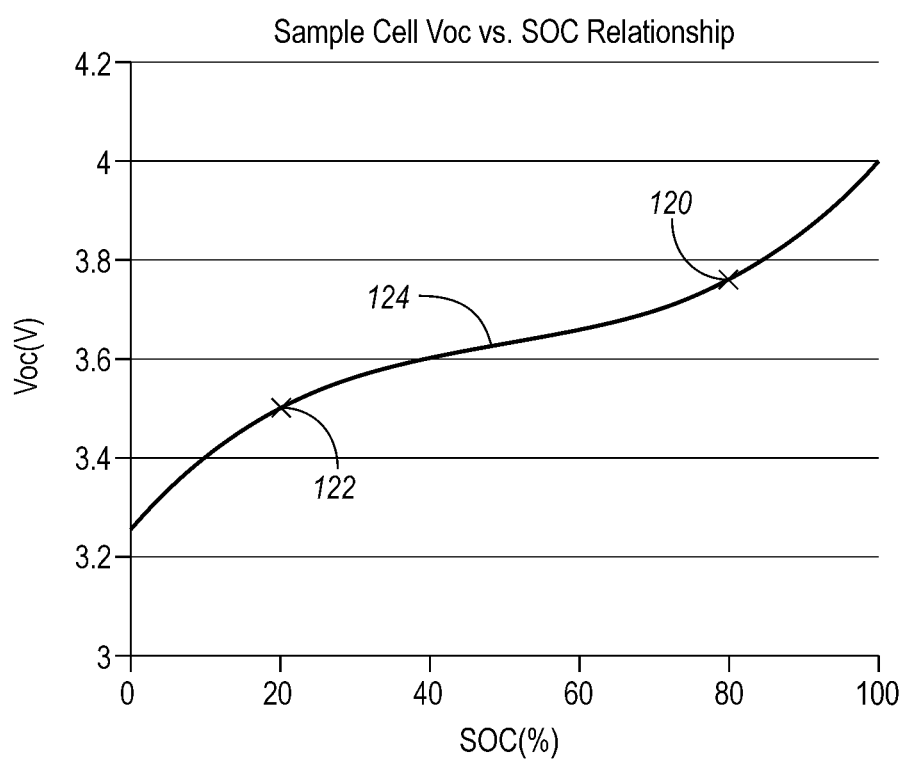
FIG. 4 is a graph that illustrates a possible open-circuit voltage (Voc) vs. battery state of charge (SOC) relationship for a typical battery cell.

For a typical Lithium-Ion battery cell, there is a relationship between SOC and the open-circuit voltage ($V_{oc}$) such that $V_{oc}=f(SOC)$. FIG. 4 shows a typical curve 124 showing the open-circuit voltage $V_{oc}$ as a function of SOC. The relationship between SOC and $V_{oc}$ may be determined from an analysis of battery properties or from testing the battery cells. The function may be such that SOC may be calculated as $f^1(V_{oc})$. The function or the inverse function may be implemented as a table lookup or an equivalent equation within a controller. The exact shape of the curve 124 may vary based on the particular formulation of the Lithium-Ion battery. The voltage $V_{oc}$ changes as a result of charging and discharging of the battery. The term $df(soc)/dsoc$ represents the slope of the curve 124.

Battery Parameter Estimation

The battery impedance parameters $r_1$, $r_2$, and C may change over operating conditions of the battery. The values may vary as a function of the battery temperature. For example, the resistance values, $r_1$ and $r_2$, may decrease as temperature increases and the capacitance, C, may increase as the temperature increases. The values may also depend on the state of charge of the battery.

The battery impedance parameter values, $r_1$, $r_2$, and C may also change over the life of the battery. For example, the resistance values may increase over the life of the battery. The increase in resistance may vary as a function of temperature and state of charge over the life of battery. Higher battery temperatures may cause a larger increase in battery resistance over time. For example, the resistance for a battery operating at 80 C may increase more than the resistance of a battery operating at 50 C over a period of time. At a constant temperature, the resistance of a battery operating at 50% state of charge may increase more than the resistance of a battery operating at 90% state of charge. These relationships may be battery chemistry dependent.

A vehicle power system using constant values of the battery impedance parameters may inaccurately calculate other battery characteristics such as state of charge. In practice, it may be desirable to estimate the impedance parameter values during vehicle operation so that changes in the parameters will continually be accounted for. A model may be utilized to estimate the various impedance parameters of the battery.

The model may be the equivalent circuit model of FIG. 3. The governing equations for the equivalent model may be written as:

$$\dot{V}_2 = -\frac{1}{r_2 C} V_2 + \frac{1}{C} * i \quad (1)$$

$$V_t = V_{oc} - V_2 - r_1 * i \quad (2)$$

$$\dot{V}_{oc} = -\frac{dV_{oc}}{dSOC} \frac{\eta I}{Q} \quad (3)$$

where Q is the battery capacity, $\eta$ is the charge/discharge efficiency, i is the current, $\dot{V}_2$ is the time based derivative of $V_2$, $\dot{V}_{oc}$ is the time based derivative of $V_{oc}$ and $dV_{oc}/dSOC$ is the SOC based derivative of $V_{oc}$.

Combining equations (1) through (3) yields the following:

$$\begin{bmatrix} \frac{dV_{oc}}{dt} \\ \frac{dV_2}{dt} \end{bmatrix} = \begin{bmatrix} 0 & 0 \\ 0 & -\frac{1}{C*r_2} \end{bmatrix} * \begin{bmatrix} V_{oc} \\ V_2 \end{bmatrix} + \begin{bmatrix} -\frac{dV_{oc}}{dSOC}*\eta \\ Q \\ \frac{1}{C} \end{bmatrix} * i \quad (4)$$

$$V_t(t) = \begin{bmatrix} 1 & -1 \end{bmatrix} * \begin{bmatrix} V_{oc} \\ V_2 \end{bmatrix} + [-r_1]*i \quad (5)$$

An observer for equations (4) and (5) can be expressed as follows:

$$\begin{bmatrix} \frac{d\hat{V}_{oc}}{dt} \\ \frac{d\hat{V}_2}{dt} \end{bmatrix} = \begin{bmatrix} 0 & 0 \\ 0 & -\frac{1}{C*r_2} \end{bmatrix} * \begin{bmatrix} \hat{V}_{oc} \\ \hat{V}_2 \end{bmatrix} + \begin{bmatrix} -\frac{d\hat{V}_{oc}}{dSOC}*\eta \\ Q \\ \frac{1}{C} \end{bmatrix} * i + \quad (6)$$

$$L*(V_t(t) - \hat{V}_t(t))$$

$$\hat{V}_t(t) = \begin{bmatrix} 1 & -1 \end{bmatrix} * \begin{bmatrix} \hat{V}_{oc} \\ \hat{V}_2 \end{bmatrix} + [-r_1]*i \quad (7)$$

where
$V_t(t)$ is the measured cell terminal voltage,
$\hat{V}_t(t)$ is an estimate of the cell terminal voltage,
$\hat{V}_{oc}$ is an estimate of the cell open-circuit voltage,
$V_2$ is an estimate of the voltage across the capacitive element, and
L is a gain matrix chosen so that the error dynamics are stable under all conditions.

The above model provides an estimate of the open-circuit voltage and the voltage across the capacitive network of the ECM. As the observer error approaches zero, the estimates may be considered to be sufficiently accurate. The above model relies on impedance parameter values such as $r_1$, $r_2$, and C. In order for the model to be accurate, the parameter values may need to be known with sufficient accuracy. As the parameter values may vary over time, it may be desirable to estimate the parameter values.

A possible representation of the battery parameter learning model from above may be as follows:

$$[V_{oc}(t) - V_t(t)] = \begin{bmatrix} \frac{dV_t(t)}{dt} - \frac{dV_{oc}(t)}{dt} & i(t) & \frac{di(t)}{dt} \end{bmatrix} * \begin{bmatrix} r_2 * C \\ r_1 + r_2 \\ r_1 * r_2 * C \end{bmatrix} \quad (8)$$

A Kalman filter-based recursive parameter estimation scheme can be used to estimate the impedance parameters ($r_1$, $r_2$, C) of the observer of equations (6) and (7). A discretized form of these parameters can be expressed as a function of the system states as follows:

$$[(V_{oc}(k) - V(k))] = \quad (9)$$

$$\left[ \frac{T_s}{2}((V_t(k) - V_{oc}(k)) - (V_t(k-1) - V_{oc}(k-1)))i(k) \frac{T_s}{2} * \right.$$

-continued $$(i(k) + i(k-1))] * \begin{bmatrix} r_2 * C \\ r_1 + r_2 \\ r_1 * r_2 * C \end{bmatrix}$$

The Kalman filter recursive parameter estimation can be achieved by expressing equation (8) in the form:

$$Y(k) = \Phi^T(k) * \Theta(k) \quad (10)$$

where $\Phi$ is referred to as the regressor and $\Theta$ is the parameter vector.

The Kalman filter estimation scheme may then expressed by the following equations:

$$\hat{\Theta}(k+1) = \hat{\Theta}(k) + K(k) * (Y(k+1) - \Phi^T(k) * \hat{\Theta}(k)) \quad (11)$$

$$K(k+1) = Q(k+1) * \Phi(k+1) \quad (12)$$

$$Q(k+1) = \frac{P(k)}{R_2 + (\Phi^T(k+1) * P(k) * \Phi(k+1))} \quad (13)$$

$$P(k+1) = P(k) + R_1 - \frac{P(k) * \Phi(k) * \Phi^T(k) * P(k)}{R_2 + (\Phi^T(k+1) * P(k) * \Phi(k+1))} \quad (14)$$

where $\hat{\Theta}(k+1)$ is the estimate of the parameters from equation (8), K, Q, and P are calculated as shown, and $R_1$ and $R_2$ are constants. After the parameters are calculated using the Kalman filter algorithm, the parameters can be used in equations (6) and (7) to obtain an estimate of the state variables. Once $V_{oc}$ is estimated, the value of SOC can be determined according to FIG. 4. Other parameter estimation schemes, such as least-squares estimation, may also be utilized.

The above parameter estimation requires a value of $V_{oc}$. $V_{oc}$ may be calculated from equation (3). At the start of an ignition cycle after the battery is rested, the terminal voltage and the open-circuit voltage may be considered to be equal. A measurement of the terminal voltage may be used as the starting value for $V_{oc}$. Equation (3) may then be used to estimate the open-circuit voltage as a function of current. Once reasonably accurate parameter estimates are available, the open-circuit voltage estimate derived from equations (6) and (7) may be used.

One possible model may consider the current (i) as the input, the voltage ($V_2$) as a state, and the term ($V_{oc}-V$) as an output. The battery impedance parameters ($r_1$, $r_2$ and c) or their various combinations may also be treated as states to be identified. Once the battery ECM parameters and other unknowns are identified, the SOC and the power capability may be calculated based on operating limits of a battery voltage and current, and the current battery state.

Various values may be measured on a per-cell basis or on an overall pack basis. For example, the terminal voltage, $V_t$, may be measured for each cell of the traction battery. The current, i, may be measured for the entire traction battery since the same current may flow through each cell. Different pack configurations may require different combinations of measurements. The estimation model may be performed for each cell and the cell values may then be combined to arrive at an overall pack value.

Another possible implementation may utilize an Extended Kalman Filter (EKF). An EKF is a dynamic system, that is governed by equations of the following form:

$$x_k = f(x_{k-1}, u_{k-1}, w_{k-1}) \quad (15)$$

$$z_k = h(x_k, v_{k-1}) \quad (16)$$

where: $x_k$ may include the state $V_2$ and the other battery ECM parameters; $u_k$ is the input (e.g., battery current); $w_k$ is the process noise; $z_k$ may be the output (e.g., $V_{oc}-V$); and $v_k$ is the measurement noise.

One possible set of states for the governing equations for the equivalent model may be chosen as follows:

$$x = \begin{bmatrix} x_1 \\ x_2 \\ x_3 \\ x_4 \end{bmatrix} = \begin{bmatrix} V_2 \\ 1/(r_2 C) \\ 1/C \\ r_1 \end{bmatrix} \quad (17)$$

The corresponding state space equations of equations (1) and (2), in discrete or continuous time, may be expressed in the form of Equations (3) and (4). Based on the system model described, an observer may be designed to estimate the extended states ($x_1$, $x_2$, $x_3$ and $x_4$). Once the states are estimated, the voltage and impedance parameter values ($V_2$, $r_1$, $r_2$, and C) may be calculated as a function of the states as follows:

$$\hat{V}_2 = x_1 \quad (18)$$

$$\hat{r}_1 = x_4 \quad (19)$$

$$\hat{r}_2 = x_3/x_2 \quad (20)$$

$$\hat{C} = 1/x_3 \quad (21)$$

The complete set of EKF equations consists of time update equations and measurement update equations. The EKF time update equations project the state and covariance estimate from the previous time step to the current time step:

$$\hat{x}_k^- = f(\hat{x}_{k-1}, u_{k-1}, 0) \quad (22)$$

$$P_k^- = A_k P_{k-1} A_k^T + W_k Q_{k-1} W_k^T \quad (23)$$

where: $\hat{x}_k^-$ represents a priori estimate of $x_k$; $P_k^-$ represents a priori estimate error covariance matrix; $A_k$ represents the Jacobian matrix of the partial derivatives of f(x, u, w) with respect to x; $P_{k-1}$ represents a posteriori estimate error matrix of last step; $A_k^T$ represents transpose of matrix $A_k$; $W_k$ represents the Jacobian matrix of the partial derivatives of f(x, u, w) with respect to process noise variable w; $Q_{k-1}$ represents a process noise covariance matrix, and $W_k^T$ represents transpose of matrix $W_k$.

The matrix $A_k$ may be constructed from the set of state equations defined by combining the system equations and the system states. The input, u, in this case, may include the current measurement, i.

The measurement update equations correct the state and covariance estimate with the measurement:

$$K_k = P_k^- H_k^T (H_k P_k^- H_k^T + V_k R_k V_k^T)^{-1} \quad (24)$$

$$\hat{x}_k = \hat{x}_k^- + K_k(z_k - h(\hat{x}_k^-, 0)) \quad (25)$$

$$P_k = (I - K_k H_k) P_k^- \quad (26)$$

where: $K_k$ represents the EKF gain; $H_k$ represents the Jacobian matrix of the partial derivatives of h with respect to x; $H_k^T$ is the transpose of $H_k$; $R_k$ represents a measurement noise covariance matrix; $V_k$ represents the Jacobian matrix of the partial derivatives of h with respect to measurement noise variable v; $z_k$ represents the measured output values; and $V_k^T$ is the transpose of $V_k$.

In the EKF model, the resistance and capacitance parameters may be assumed to be slowly varying and have a derivative of zero. The estimation objective may be to identify the time-varying values of the circuit parameters. In the above model, three impedance parameters may be identified: $r_1$, $r_2$, and C. More comprehensive models may additionally estimate $V_{oc}$ as a time-varying parameter. Other model formulations may incorporate a second RC pair to represent a slow and a fast voltage recovery dynamics. These formulations may increase the number of states in the model. Other battery properties may then be calculated based on the identified parameters or may be estimated as part of the model.

One of ordinary skill in the art can construct and implement the EKF given a set of model equations. The system of equations described above is one example of a system model for a battery system. Other formulations are possible and the methods described will work equally well on other formulations.

In the above example, i and $V_t$ may be measured quantities. The quantity $V_{oc}$ may be derived from the measured quantities and the parameter estimates from the EKF. Once $V_{oc}$ is known, the state of charge may be calculated based on FIG. 4. Knowing the above parameters may allow one to calculate other battery properties.

Battery Capacity Estimation

There are two main categories of battery capacity estimation algorithms. The first category bases the calculation on the definition of capacity—battery throughput divided by a difference in state of charge (SOC) values. This approach is based on knowledge of two separate SOC values obtained independent of battery capacity. The calculation may be expressed as:

$$Q = \frac{\int_{T_i}^{T_f} i\, dt}{SOC_i - SOC_f} = \frac{\text{Throughput}}{SOC_i - SOC_f} \quad (27)$$

where $SOC_i$ and $SOC_f$ are the state of charge values at times $T_i$ and $T_f$ respectively. The battery throughput may be defined as the integral of current over a time period. When implemented in a controller, the integral may be replaced by a summation of current values multiplied by the sample time.

Systems using the above formulation are present in the prior art. One prior art approach is to obtain the state of charge values over two key-on/key-off cycles. For a lithium-ion battery, it is well-known that after the battery has been resting a sufficient time, the terminal voltage will be very close to the open-circuit voltage of the battery (i.e., $V_t = V_{oc}$). The terminal voltage may be measured at power-up and the state of charge may be derived from the open-circuit voltage (e.g., FIG. 4). The throughput may be calculated over each ignition cycle and stored in a non-volatile memory for use in the next ignition cycle.

The accuracy of the capacity definition approach depends on several factors. The calculation is dependent upon two key-on and key-off cycles to obtain the SOC difference. The two ignition cycles must be separated by enough time so that the battery is sufficiently rested and enough current throughput through the battery. The result further depends on the key-on voltage readings for the open-circuit voltage values. To calculate throughput, current integration may be used which includes current sensor inaccuracy and current integration error. Current leakage during key-off periods may not be accounted for. In addition, the temperature change between the two key cycles may be large. The result of these inaccuracies is that the battery capacity may be difficult to calculate accurately using such an approach. In particular, small changes in the battery capacity may not be discernible due to the inaccuracies described.

The impact of voltage sensor inaccuracy on battery capacity using the above two key-on/key-off cycles may be expressed as follows:

$$\Delta Q = \frac{\left(\int_0^T i(\tau)d\tau\right) * (\Delta V) * \left(\frac{df}{dV}\bigg|OCV_1 + \frac{df}{dV}\bigg|OCV_2\right)}{(f(OCV_2) - f(OCV_1))^2} \quad (28)$$

where $\Delta Q$ is the potential capacity estimation error, $OCV_1$ and $OCV_2$ are the two key-on/key-off voltage readings in which $f(OCV_x)$ defines the SOC at that particular voltage, T is the total time used in current integration, and $\Delta V$ represents the voltage sensor inaccuracy. df/dV is the derivative of the SOC-OCV curve at the given OCV value.

As a worst case example, consider a 25 Ah cell with an SOC change of 20% (5 Ah throughput) as measured at the start of two separate ignition cycles. Assuming a voltage sensor inaccuracy of 10 mV and a df/dV of approximately 1, the capacity estimation error due to voltage sensor inaccuracy will be $\Delta Q$=9000 A-s. or approximately 10% of the battery capacity.

The second category of battery capacity estimation algorithms learns the battery capacity based on system identification theory in which the battery capacity is learned as part of a battery model. The model-based approach also has some limitations. Normally, the battery capacity is only a weakly identifiable variable. In particular, when many other battery parameters are lumped together, the weak identifiability of the battery capacity makes a model-based Kalman filter approach impractical when the battery measurements are corrupted by noise, sensor inaccuracies, or battery modeling errors. Based on this, it may be desirable to eliminate the errors induced in the battery capacity estimation by the open-circuit voltage sensing error, unaccounted leakage current, and temperature changes between two consecutive drive cycles.

A battery model may be periodically executed in a vehicle controller throughout the battery life. Based on the learned model parameters, an SOC observer may be designed such that SOC may be accurately estimated. The SOC observer may be implemented and parameter estimates may be obtained.

There are several approaches that may be applied to determine when to estimate the battery parameters. One approach may be to learn the parameters at all times. However, there are drawbacks to this approach. The equivalent circuit model is only an approximation of the real battery behavior. Sensor biases and inaccuracies may be present in the measurement signals. These factors contribute to inaccuracies in the parameter estimation, particularly when the input is not sufficiently rich or persistently excited. An input is not sufficiently rich if the input does not provide proper excitation to the battery to allow accurate parameter estimation. The richness or persistency of the excitation may also depend on the presence of various frequencies in the input signal. The input signal for a traction battery may be a battery power demand. For example, operating at a constant current may not provide enough variation to ascertain dynamic properties of the model.

Another approach may be to bypass the parameter estimation when the input is not considered sufficiently rich. An open-loop observer may be used to estimate battery state variables during these intervals. This approach involves detecting when the conditions are not sufficiently rich and may provide better estimates than the continual learning approach. However, an issue with this approach may be the effect of an extended period where the input is not sufficiently rich for parameter estimation. The open-loop observer may provide sufficient estimates initially, but over time the estimates may become inaccurate.

Issues may arise when the battery system operates for an extended period of time under conditions that are not sufficiently rich to accurately learn the parameters. In these situations, the parameters may not be accurately learned for a long period time. The last learned values may differ significantly from the true value at the present time. For example, the resistance $r_1$ in the circuit model may increase as the battery ages. This may cause an unacceptable increase in the battery power capability error.

Another approach may be to actively excite the battery for parameter estimation purposes. The system may try to generate a battery input via torque modulation or other control actions to create an input that is persistently excited for parameter estimation purposes. The battery power demand may be such that sufficient frequency components are excited such that accurate parameter estimation may be achieved. The controls actions are ideally transparent to the end users. For example, any modification to the traction battery power demand should not affect acceleration of the vehicle.

Persistent Excitation and Estimation Convergence Conditions

In order to effectively learn the battery parameter values, input conditions to the estimation model may need to be valid. When valid input conditions are satisfied, the battery parameter values may be learned with sufficient accuracy. In the absence of valid input conditions, battery parameter learning may result in inaccurate values.

One condition that may be met is a persistent excitation condition. In order to effectively estimate the parameters shown above, an associated "persistent excitation" matrix (PEM) may be defined as follows:

$$PEM = \frac{1}{T_{pe}} * \int_{t_0}^{t_0+T_{pe}} \left[ \frac{d(V_t(\tau) - V_{oc}(\tau))}{d\tau} i(\tau) \frac{di(\tau)}{d\tau} \right]^T * \qquad (29)$$
$$\left[ \frac{d(V_t(\tau) - V_{oc}(\tau))}{d\tau} i(\tau) \frac{di(\tau)}{d\tau} \right] d\tau$$

where $T_{pe}$ is the time interval over which the integration takes place. Alternatively, instantaneous values may be utilized (e.g., eliminate the integration in the above equation). The integration may help filter out noisy signals and prevent rapid changes of the signals. The discrete form of equation (9) may also be used to formulate the PEM. For example, $T_{pe}$ may be set to 5 seconds so that the PEM elements are integrated over a 5 second interval. For the parameter estimates to be accurate, the PEM may need to meet certain positive semi-definiteness properties. A matrix, P, is positive semi-definite if $x^T Px \geq 0$ for all x. The persistent excitation condition is that matrices calculated as (PEM$-\alpha_1 I$) and ($\alpha_0 I-$PEM), where I is an identity matrix, are positive semi-definite. The persistent excitation condition may be expressed as $\alpha_0 I \geq PEM \geq \alpha_1 I$, but care must be taken as the expression is a matrix expression and not a scalar expression. If a matrix is positive semi-definite, all eigenvalues of the matrix are non-negative. A matrix, P, that is positive definite ($x^T Px > 0$ for all x) is invertible. The expression $\alpha_0 I \geq PEM \geq \alpha_1 I$ may be referred to as a persistent excitation condition. Note that the above PEM is of a form associated with the chosen estimation model. Different model formulations may result in a different PEM and may have a different persistent excitation condition.

In other words, if the regressor-based persistent excitation matrix satisfies certain positive definiteness conditions, then the parameter estimates may be unbiased. When the persistent excitation condition is met, the parameters may be accurately learned as the input signals may be considered to be sufficiently rich. The values $\alpha_0$ and $\alpha_1$ may define an upper and lower bound for the positive semi-definiteness of the persistent excitation matrix. The values $\alpha_0$ and $\alpha_1$ may depend on characteristics of the battery system. When the positive-definiteness criteria for the regressor-based matrix are satisfied, the input conditions may be considered to be valid. The values of $T_{pe}$, $\alpha_0$ and $\alpha_1$ may be adjusted to modify the persistent excitation condition to meet signal richness requirements for different purposes.

The persistent excitation condition may indicate that input conditions are valid for parameter estimation but does not necessarily indicate that the parameter estimation has converged to the true values. Additional monitoring of estimation errors may be performed to ascertain when the parameter estimates are converging to the actual values. An estimation convergence condition may be monitored to ascertain the convergence of the parameter estimates. One way to ascertain the quality of the parameter estimates may be to monitor the estimation error of one or more modeled variables or parameters. An error between an estimated value and a measured value may be monitored. When the magnitude of the error is bounded by a certain value over a predetermined time period, the parameter estimates may be considered to be acceptable. For example, the projection error ($V_t(t) - \hat{V}_t(t)$) from equation (6) may be monitored for convergence. The estimation convergence condition may be that the magnitude of the estimation error be less than a predetermined threshold for a predetermined time period. One or more parameter errors may be monitored and the selection of the monitored values may depend on the model and measurements that are available.

When the battery is sufficiently excited (e.g., persistent excitation condition satisfied) and the estimation error in the parameter observer remains bounded for a given period of time (e.g., estimation convergence conditions satisfied), the SOC error may also be bounded by a predetermined value. The SOC error bound may be designed to be sufficiently small and the SOC value learned by the SOC observer may be used to initialize the ampere-hour integration based SOC method. Calibration of SOC error bound may be application specific. For example, for vehicle drive control, a 2% accuracy may be sufficient. However, for battery capacity estimation, a more accurate bound may be desired. A different error magnitude threshold may be used for the estimation error depending on the desired accuracy. A lower threshold may improve accuracy of the estimation.

The above persistent excitation condition may be implemented in a controller. The controller may be programmed to calculate each element of the matrix and ascertain the positive semi-definiteness condition. If the persistent excitation conditions of positive semi-definiteness are met, a flag may be set indicating that the input is sufficiently rich or persistently excited for accurate parameter estimation. This flag may be used to initiate a parameter estimation cycle. Alternatively, parameters may be estimated at all times but the estimated values may be ignored until the persistent excitation condition is satisfied for a predetermined period of time.

Once the battery is sufficiently excited and the estimation error is bounded for a given period of time, the SOC error may be considered sufficiently small. This may be referred to as SOC initialization-on-the-fly (SIOF). This term is used as an accurate estimate of the open-circuit voltage may be obtained, and hence an accurate value for SOC, at any time while the controller is operating, not just at startup. The SOC values may be obtained "on-the-fly" or at any time as opposed to the prior art "startup-only" SOC initialization. Two such events during a common ignition cycle may be used to replace the two key-on voltage readings used in the prior art. This approach does not depend on key-on and key-off cycles to determine SOC values. The SOC values may be obtained at any time while the system is operating. This scheme allows the battery capacity to be calculated whenever the SOC error is sufficiently small. The SIOF condition may be met when the battery is sufficiently excited and the estimation error in the model parameter observer remains bounded for a given period of time.

SOC estimation error due to voltage and current sensor accuracy may still remain. The most significant error may be:

$$K(k)*(\|\Delta V\|+(\bar{r}_1*\|\Delta I\|)) \qquad (30)$$

where $K(k)$ is a gain, normally non-stationary, $\Delta V$ and $\Delta I$ are voltage and sensor inaccuracies, respectively, and $r_1$ is the battery internal resistance value at a given temperature and SOC. The impact of voltage and current sensor inaccuracies may be reduced by limiting capacity learning for temperatures above a certain value and setting the observer gain to a smaller value. The error estimation is not impacted by changes in the capacity.

Given the above formulation, a system may determine if the battery system is persistently excited such that acceptable estimation results may be achieved. One technique may be to monitor the persistent excitation condition described above. A passive approach might monitor the persistent excitation condition and perform parameter learning when the condition is satisfied. The passive approach relies on normal operation of the battery and learns the parameter values when the conditions are proper.

An active excitation approach may create conditions such that the persistent excitation condition is satisfied. This may include operating the battery pack in such a manner as to satisfy the persistent excitation conditions. This may require the controller to command other devices or subsystems to operate by providing power to or receiving power from the battery. Ideally, this operation should be transparent to the vehicle occupants. The active excitation approach may allow the parameters to be learned at any time with the addition of the active excitation of the battery system.

Scheduling Battery Capacity Based on Learning Window

Once a method of calculating battery capacity is defined, a related issue is scheduling the battery capacity learning. A system may need to determine how often battery capacity needs to be learned. There may be tradeoffs between the amount of execution time spent on capacity learning and the accuracy of the battery capacity value. Studies indicate that a lithium-ion battery capacity fade follows a square-root-of-time law under normal temperatures. The magnitude of capacity fade is larger earlier in the battery life. Based on this observation, battery capacity learning may be scheduled based on calendar life of the battery. Since the magnitude of change is greater earlier in battery life, learning events may be scheduled more frequently early in the battery life. That is, as the age of the battery increases, the time interval between successive battery capacity determinations may be increased.

The persistent excitation and estimation convergence conditions described above may provide a check as to when battery capacity may be accurately estimated. There may be situations where conditions are not met for long periods of time. Under these situations, "active excitation" of the battery for estimation purposes may be initiated. Active excitation of the battery attempts to cause battery operating conditions such that the persistent excitation condition for capacity estimation is satisfied. When the persistent excitation condition is satisfied, the estimation convergence condition may also be satisfied.

Figure 5:
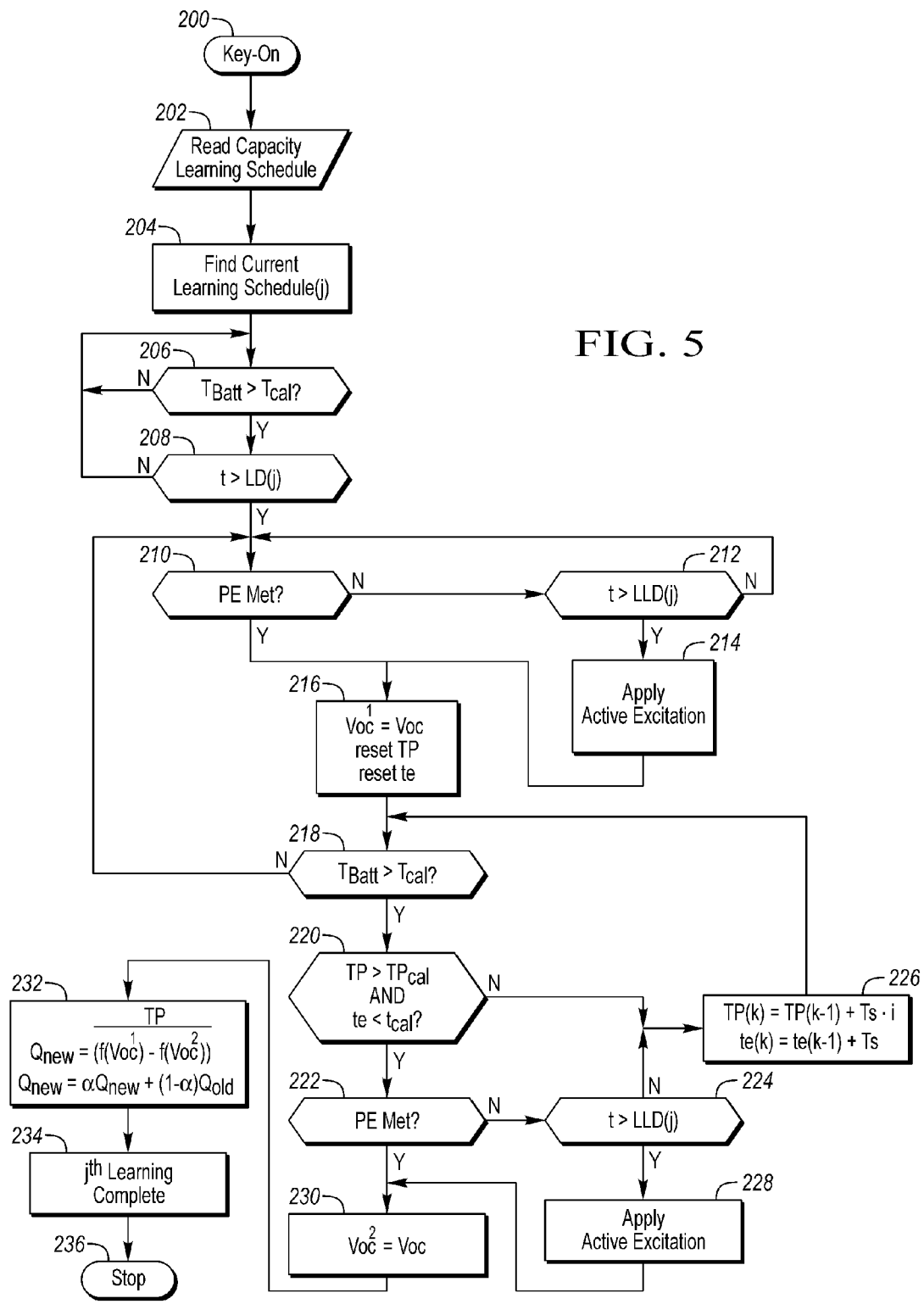
FIG. 5 is a flowchart of a possible method for calculating battery capacity incorporating active excitation of the traction battery.

Capacity learning may be scheduled according to an acceptable capacity error and the square-root-of-time law of capacity fade. Scheduling may be evenly distributed based on in-use time. One example of a system that calculates battery power capacity is shown in FIG. 5. A predetermined schedule of learning windows may be defined and stored in controller memory. There may be many methods of setting the learning windows. For example, the expected capacity fade may be analyzed and learning windows may be created that correspond to equal changes in capacity.

For each scheduled capacity learning event, two time values may be defined. A learn date (LD) may be defined and may be a date and time in relative calendar terms associated with beginning of life calendar time and defines a desired time that the capacity should be learned. A latest learning date (LLD) may be defined that may be a date and time in relative calendar terms associated with the beginning of life calendar time and defines the latest time at which the capacity should be learned. The two values may define a target window of time in which the capacity may be learned. A sequence of capacity learning events, each event having associated time values defined, may be predetermined and stored in controller memory.

The controller may be programmed to maintain a battery life time counter (t) that indicates the elapsed time since the battery has been deployed. The battery life time counter (t) may be reset to zero at the start of the battery life time. The life time counter may be based on a calendar date and time that is maintained by a controller within the vehicle. The battery life time counter (t) may be incremented periodically over the life time of the battery to reflect the time since the start of battery life. The sequence of learning dates may be relative to the battery beginning of life. At vehicle key-on, the battery life time counter may be compared to the learning schedule to determine if battery capacity needs to be calculated.

At vehicle key-on 200, the controller may read the capacity learning schedule into memory 202. The capacity learning schedule may be comprised of a sequence of pairs of learn dates (LD) and latest learning dates (LLD). The pairs may be indexed such that an index, j, into the learning schedule returns the $j^{th}$ learn date and the $j^{th}$ latest learn date. Each pair in the learning schedule may have an associated flag that indicates whether the learning has been completed yet for that pair. The current learning schedule index may be ascertained 204 from the battery life time counter and the learn dates of the learning schedule. The learning schedule may be searched to find the next index for which the learning has not yet been completed. The index, j, of this pair may be retained during controller operation for accessing the learning schedule.

Before calculating battery capacity, the battery temperature, $T_{batt}$, may be checked 206. To improve the estimation, capacity may be learned when the battery temperature is above a predetermined threshold, $T_{cal}$. If the temperature is below the predetermined threshold, parameter estimation may be delayed until the temperature is above the threshold.

As described earlier, the learning schedule may define a window of time in which to calculate the battery capacity. The window may be defined by the index and the two time values at that index—a learn date [LD(j)] and a latest learning date [LLD(j)]. The controller may compare the battery life time counter to the indexed learn date 208. If the battery life time counter, t, has not reached the indexed learn date, the system may continue to check the temperature 206 and the time 208. In this case, the battery capacity may not be estimated at the present time.

If the battery life time counter exceeds the indexed learn date, then a passive excitation (PE) condition may be checked 210. The PE condition is met when the persistent excitation condition and the estimation convergence condition are satisfied. If the PE condition is met, the controller may store the present open-circuit voltage, or alternatively the state of charge associated with the open-circuit voltage, and reset elapsed time (te) and throughput counter (TP) values 216.

If the PE condition is not met, the battery life time counter may be compared to the currently indexed latest learning date [LLD(j)] 212. If the battery life time counter exceeds the currently indexed LLD, then active excitation of the traction battery may be initiated 214. If the battery life time counter does not exceed the currently indexed LLD, then the execution may go back to checking the PE condition 210. In that case in which active excitation is applied, after the active excitation is applied, the estimated open-circuit voltage may be sampled 216. This may assume that the active excitation process is executed for a duration that guarantees that the PE condition is met. Alternatively, after active excitation is applied, the PE condition may be monitored to ensure that the active excitation created the proper battery power demand.

A first open-circuit voltage value, $V_{oc}^1$, may be stored as the present learned value for the open-circuit voltage. This value may be the result of the battery impedance parameter estimation model that is operating. A throughput (TP) value may be reset to a value of zero. An elapsed time, $t_e$, value may be reset to zero. The throughput value may be used to accumulate the current using an ampere-hour integration. During operation, the throughput value may be incremented by the product of the current and the sampling period.

Once the first open-circuit voltage is stored, the battery temperature may be compared to a calibrated temperature 218. If the battery temperature, $T_{batt}$, does not exceed the calibrated temperature, $T_{cal}$, the learning may be reset and the execution may return to checking the PE condition 210. When the battery temperature exceeds the threshold, other criteria may be checked 220.

The throughput (TP) may be compared to a threshold ($TP_{cal}$). In addition, the elapsed time, $t_e$, may be compared to a calibrated time, $t_{cal}$. If the throughput exceeds the throughput threshold and the elapsed time is less than a calibrated value, then the system may check the PE condition 222 again. The time and throughput conditions may ensure that the battery has been operated enough so that a reasonable SOC difference is present. Should the criteria not be met, the values of throughput (TP) and the elapsed time ($t_e$) may be incremented 226.

The throughput (TP) may be incremented by a product of the sampling time and the measured current. The elapsed time may be incremented by the sampling time at each execution interval. Execution may then be returned to the temperature check 218.

When the TP and $t_e$ criteria 220 are met, the PE condition may be checked 222. If the PE condition is met, the system may store a second open-circuit voltage value, $V_{oc}^2$, 230 for the final calculation of battery capacity. If the PE condition is not met, the controller may check to see if the currently indexed latest learning date is exceeded 224. The battery life time counter may be compared to the currently indexed latest learning date. If the battery life time counter exceeds the currently indexed LLD, then active excitation may be initiated 228. Should the battery life time counter not exceed the currently indexed LLD then the execution may increment the TP and $t_e$ values 226.

After active excitation, the second open-circuit voltage may be stored 230 as the current open-circuit voltage value from the model. The active excitation may need to be applied for some period of time to allow the PE condition to be satisfied. Once again, an alternative may be to actually check the PE condition to ensure that the active excitation worked properly.

Once the second open-circuit value is saved, the capacity may be calculated 232 as follows:

$$Q_{new} = \frac{\text{Throughput}}{SOC_1 - SOC_2} \quad (31)$$

The capacity may optionally be filtered 232 using a low-pass filter. Once the capacity value is learned, the capacity learning for the scheduled event may be considered complete. A flag may be stored with the learning schedule entry to indicate that the capacity learning for this entry has been completed. Note that the SOC values may be derived as a function of the open-circuit voltage as discussed in relation to FIG. 4. The capacity value may be filtered by defining a value, a, that weighs the contribution of the currently calculated capacity and the previous capacity value. This may be expressed as:

$$Q_{new} = \alpha Q_{new} + (1-\alpha) Q_{old} \quad (32)$$

where $Q_{old}$ represents the previous capacity value.

Once the new battery capacity is calculated, the learning is completed for the indexed learn date 234. The battery capacity for the index may be stored. A flag may also be stored with the index to indicate that learning for the indexed schedule values is completed. The execution may then stop 236 until subsequent key-on cycles at which time the process may be repeated as a new learning schedule index may be available.

In some situations, the inputs necessary to provide a persistent excitation may not be present to meet the criteria for passive excitation. This may be due to vehicle controls and operator driving habits. In such a situation, the battery life time counter may exceed the latest learning date for the scheduled learning event. Should the battery life time counter exceed the latest learning date without the capacity learning being completed, the system may request that active excitation be performed.

Active excitation may attempt to use other vehicle controls (for example, high-voltage components such as electric air conditioning, electric heater, power steering, or electric vehicle motor control) such that the battery inputs satisfy the persistent excitation criteria. Ideally, the operation of the additional components will be performed in a manner transparent to the operator. The active excitation may be constructed such that a net power at the wheels does not change during the operation.

To summarize, the battery capacity calculation does not necessarily require two open circuit voltage readings for SOC obtained at the start of two separate ignition cycles. A model-based system may be used to estimate battery capacity when SOC estimates have the highest confidence. Using the above method, it may be desirable that the current integration and SOC values be independent of one another to avoid circular calculations. A pure ampere-hour integration based SOC calculation makes the capacity estimate circular as both the numerator and denominator of the equation would rely on the current integration. The system described uses an ampere-hour integration for the numerator but relies on model-based parameters for the denominator, thus avoiding the circular calculations. In addition, if conditions are such that SOC estimates have a low confidence, the controller may operate the traction battery to achieve conditions in which high confidence estimates may be obtained.

It is easily shown that the effect of errors in the capacity value have negligible effect on the SOC estimation from the model. The derivative of the open-circuit voltage may be expressed as:

$$\dot{V}_{oc} = -\frac{df(soc)}{dsoc} * \frac{1}{Q} * I \tag{33}$$

where Q is the charge capacity and I is the battery current. In a system in which the above equation is used in a model to calculate $V_{oc}$, the error in the open-circuit voltage during a constant current discharge may be approximated as:

$$V_{oc} - V_{oc\_est} = -\frac{df}{dSOC} * I * \frac{\Delta Q}{Q^2} * \frac{1}{L} \tag{34}$$

where $\Delta Q$ represents an error in the capacity and L represents the observer gain. The value of $\Delta Q$ may be considered to be small compared with Q. As an example, assume that I=100 Amps, L=100, df/dSOC=1, Q=25 Amp-hr=90000 Amp-sec, and $\Delta Q$=1000 Amp-sec. Using these values, the error becomes 1/8,100,000 Volts which is nearly zero. Based on the error analysis, it is reasonable to rely on a SOC estimation using an observer based on a battery model even when the battery capacity used in the model is not perfectly accurate.

Advantages of the capacity learning scheme is that the impact of voltage sensor errors and unaccounted leakage current on capacity estimation is reduced. Passive learning using battery input based on driver input and vehicle controls design may be used. Active excitation that is transparent to the driver may also be used when necessary.

The above method provides an accurate estimation of SOC based on the model parameter estimates. Once SOC is ascertained, the traction battery may be operated according to the SOC values. The traction battery may be further operated based on the battery capacity estimate.

Scheduling Active Excitation for Cell Balancing

Within a battery comprised of many connected cells, the state of charge of the cells may become unbalanced for many reasons including manufacturing variations, cell fading at different rates due to temperature distribution within the battery pack, and internal leakage at different rates due to chip design. Battery cell imbalance may be defined as a difference between SOC of the cells. Many production battery packs include a cell balancing function in which cell balancing control is triggered when a magnitude of an SOC difference between cells exceeds a predetermined value.

Cell balancing is a process that attempts to equalize the SOC of the cells by adding or subtracting charge from the affected cells. Prior art systems may initiate cell balancing when a magnitude of an SOC difference between the cells is greater than a threshold. When the SOC difference magnitude between the cells is less than a second threshold, cell balancing may be terminated. Due to inaccuracies in the SOC values, prior art system may tend to over balance the cells leading to wasted energy.

Various methods of performing cell balancing are possible. Some systems may include a switch across each cell that can selectively switch a circuit element across the cell. The circuit element may allow the cell to discharge. Alternatively, a switch may selectively connect cells together such that one cell discharges while charging another cell. Cell balancing may be achieved by selectively charging and discharging the cells of the battery until all cells have approximately the same state of charge. The scheme to be described may be applicable to any cell balancing hardware configuration.

Methods of calculating SOC, such as ampere-hour integration and model-based observers may be biased from the true values. For a system that relies on a cell voltage measurement at key on, the cell voltage sensor accuracy may cause inaccurate SOC values. Due to tolerances in the cell voltage measurements, SOC values may be inaccurate at initialization. Cell imbalances may be falsely observed due to the voltage measurement inaccuracy. Since the cell balancing strategy relies on SOC, it is desirable to ensure that the SOC values are accurate enough to initiate and terminate cell balancing.

Cell balancing may be initiated when a magnitude of an SOC difference between cells is above a predetermined value. After performing cell balancing for a period of time, the SOC difference may be re-evaluated. If the magnitude of the SOC difference is below a predetermined threshold, then cell balancing may be terminated. Note that some hysteresis may be incorporated into the thresholds for initiating and terminating cell balancing.

As discussed above, the SOC initialization-on-the fly technique may be applied to ensure high-quality SOC estimations for each cell. When the persistent excitation condition is met and the estimation convergence condition is met, the SOC may be considered accurate. Cell balancing may be initiated and terminated when high-quality SOC estimations are available for each cell.

Figure 8:
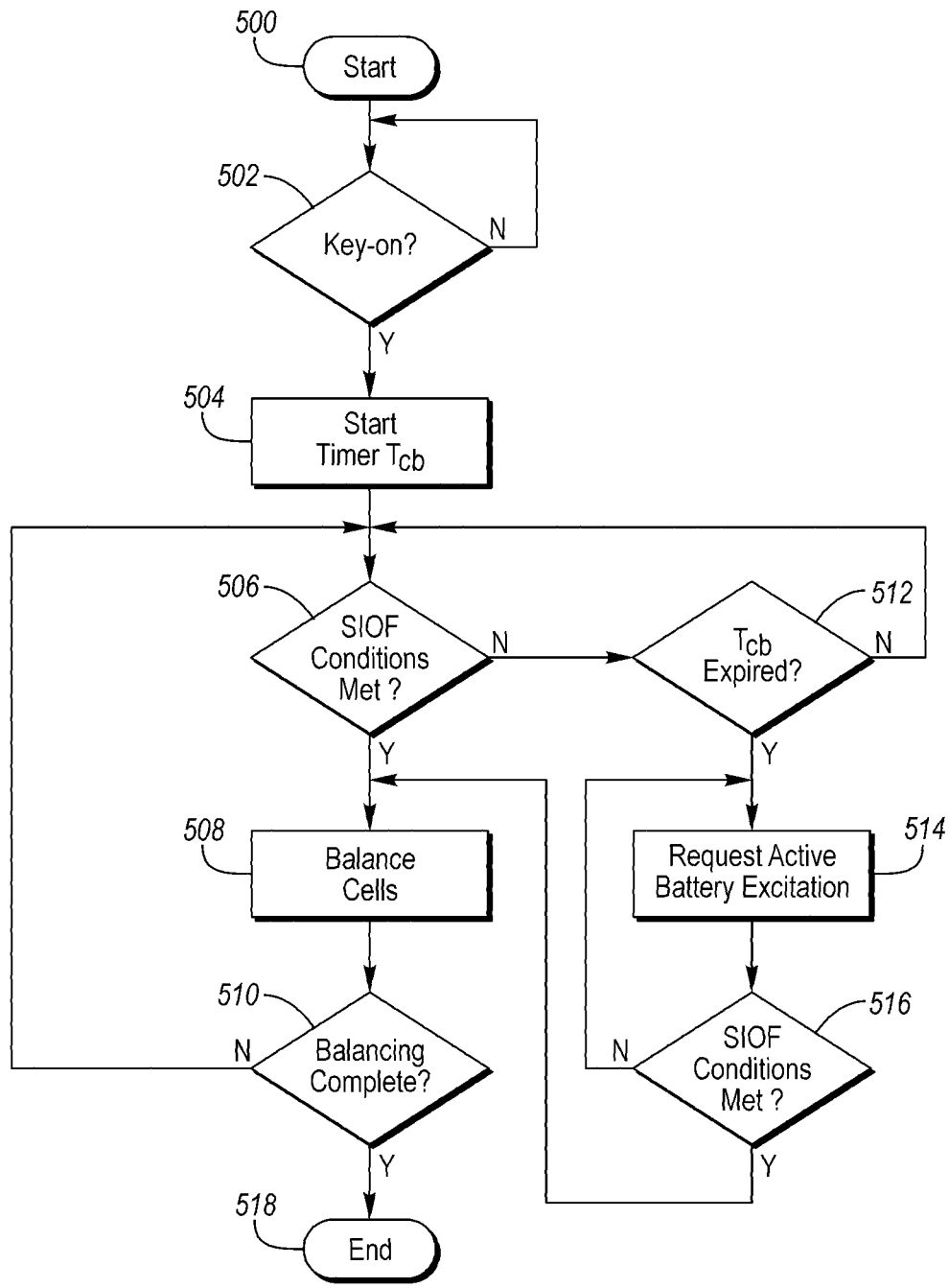
FIG. 8 is a flowchart of a possible method for performing cell balancing using active excitation of the traction battery.

FIG. 8 shows a flow chart of one possible implementation of a cell balancing strategy. At system start 500, the controller may begin checking for vehicle key-on 502. If key-on is not detected, the controller may continue to check the key-on condition 502. If key-on is detected, the controller may start a timer, $T_{cb}$ 504. The timer, $T_{cb}$, may be used to ensure that the cell balancing is performed within a predetermined amount of time. The controller may then begin checking for the SOC initialization-on-the-fly (SIOF) conditions 506. The SIOF conditions may be that persistent excitation and estimation convergence conditions be satisfied.

If the SIOF conditions are met, the system may perform cell balancing 508. At this point, SOC differences between the cells may be calculated to ascertain whether or not cell balancing is required. If cell balancing is necessary, then appropriate control actions may be taken (e.g., triggering appropriate switching devices). A check may then be made as to ascertain if the cell balancing is complete 501. Completion may require that the SOC difference magnitude be below a predetermined magnitude. If cell balancing is complete, the execution may end 518 until started again. If cell balancing is not complete, the system may continue checking the SIOF conditions 506 and continue cell balancing 508 while the SIOF conditions are met.

Should the SIOF conditions not be met, the system may check the status of the timer $T_{cb}$ 512 to ascertain if the timer has expired. Note that the timer may be implemented as a count up or count down timer. Expiration of the timer, $T_{cb}$, indicates that a predetermined amount of time has elapsed. If the timer has not expired, the system may continue checking the SIOF conditions 506. If the timer has expired, then active battery excitation may be initiated 514. The active battery excitation request may ensure that the SIOF conditions are met. After initiating active battery excitation, the SIOF conditions may be checked 516. If the SIOF conditions are not met, the system may continue requesting active battery excitation 514. If the SIOF conditions are met, the system may continue cell balancing until completion.

The system may limit the number of cell balancing cycles within a single ignition cycle to be less than a predetermined number of cycles. Limiting the number of cycles during an ignition cycle helps to avoid excessive cycling of the cell balancing logic in the event that the SOC estimation is inaccurate or that the cell balancing conditions are too narrow.

Additionally, active excitation may be requested a predetermined amount of time after the cell balancing has been initiated if the SIOF conditions are not satisfied during cell balancing. This may help to ensure that accurate SOC values are calculated during cell balancing. In addition, such a scheme may reduce the amount of time necessary for cell balancing.

By activating the active excitation of the battery, improved parameter estimates may be obtained. Battery SOC may be derived from the parameter estimates. By ensuring that conditions are proper for estimation, the system may perform more effective cell balancing. In particular, the determination that SOC levels are equalized may be more accurate so that cell balancing is more effective.

A battery control system may continuously calculate SOC and monitor the quality of the SOC during cell balancing. An advantage of the disclosed scheme is that a fixed cell balancing time is not necessary. Cell balancing may continue until the SOC values are balanced with no need for the balancing routine to run longer. Faster cell balancing times may be achieved by requesting active excitation of the battery inputs during cell balancing.

Scheduling Active Excitation Based on Quality of Parameter

Battery control signal accuracy (e.g., power capability and state of charge) using a model-based approach relies on parameter estimation accuracy, particularly the $r_1$ resistance estimate. Power capability estimation error and state of charge estimation error may be expressed as a function of resistance $r_1$ estimation error as follows:

$$\text{Power Capability Estimation Error} \propto I_{max} * \Delta r_1 \quad (35)$$

$$\text{State of Charge Estimation Error} \propto I_{max} * \Delta r_1 \quad (36)$$

The resulting estimation errors are proportional to the maximum charge or discharge current times the error in the resistance $r_1$ estimation. The resistance value may be expected to increase over the life of the battery for a given battery temperature. A value used at the battery beginning of life may not reflect the actual resistance value over time as the value increases. Upper and lower limits of the battery parameters over time may be known such that, for a given battery age, a range of expected values may be defined. It is possible that if the battery impedance parameters are not learned over time that the current resistance value may fall outside of the expected range. When the error becomes too large, it may be desirable to force the system to learn via active excitation.

Figure 6:
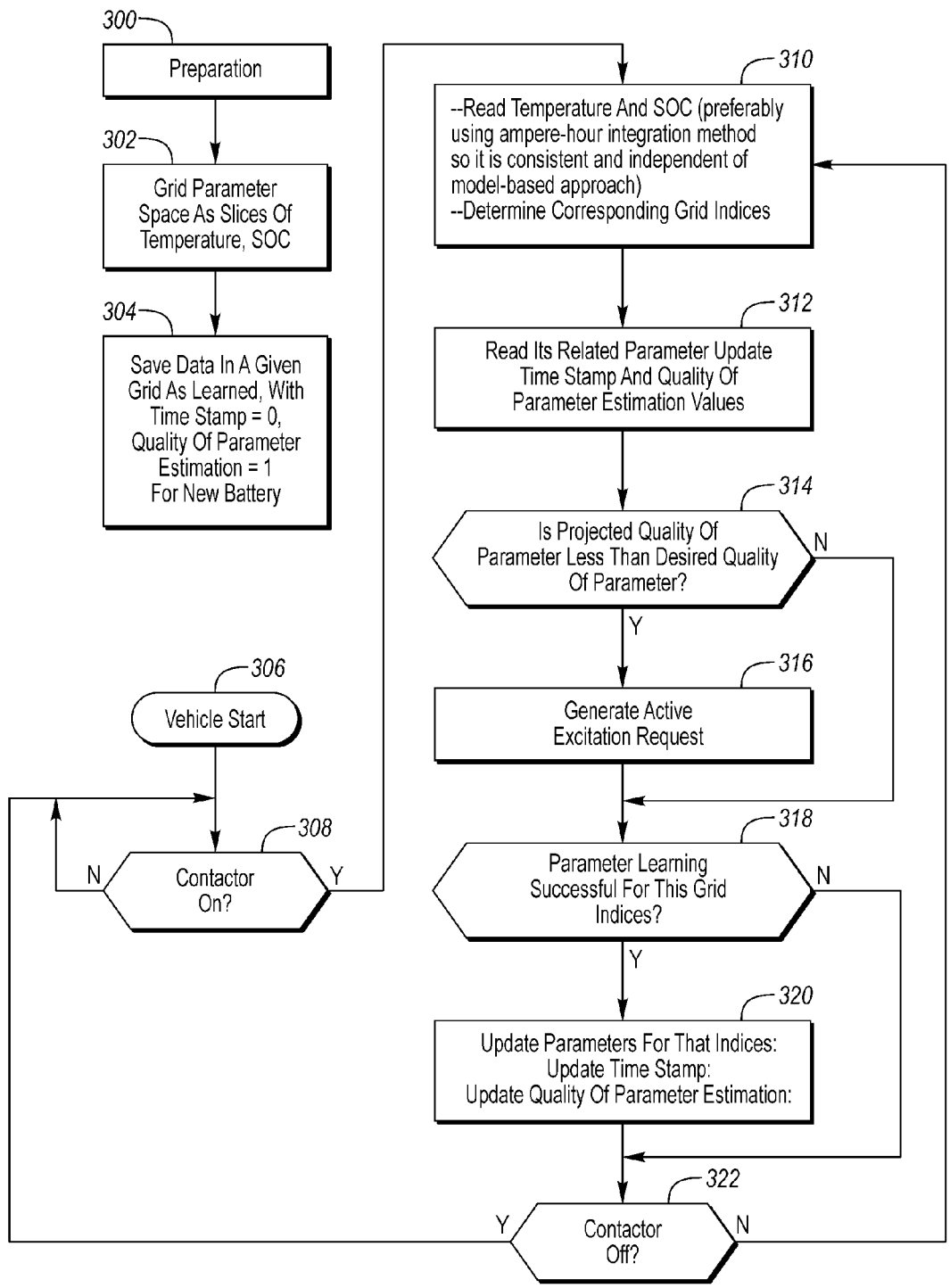
FIG. 6 is a flowchart of a possible method for estimating battery parameters using active excitation of the traction battery.

The battery impedance parameters may be initialized using parameter data based on battery life. As described earlier, the battery parameters may change over the life of the battery as a function of temperature and state of charge. FIG. 6 depicts an example flow chart of how parameter learning may be constructed. A preparation phase 300 may be initiated in which initial battery parameter values and tables are constructed. A parameter table may be constructed that defines a profile for each battery impedance parameter based on state of charge and temperature. The parameter space may be divided into a grid of different intervals of temperature and state of charge 302. The grid may be evenly spaced or unevenly spaced. The grid may be based on a partial derivative of the parameter with respect to temperature or state of charge. The temperature range (e.g., −40 C to 55 C for production battery) may be denoted as $T_{grid}=[1, \ldots, N_t]$ and the state of charge grid may be denoted $SOC_{grid}=[1, \ldots, N_s]$. The grid may be initialized with values from test data or expected values 304. For a beginning of life battery, each grid may be associated with a time stamp denoted $t_{stamp}(i,j)$ which may be initialized to zero. Each grid may have an associated Quality Of Parameter Estimation, QOPE(i,j), value which may be initialized to one. The grid may be retained in controller memory such that the data is available during subsequent ignition cycles.

The QOPE may be a value that indicates the past quality of the estimation. A value less than one may indicate that the learned parameter set for the given indices (i,j) has larger variations. A higher value may indicate less variation over time and may represent a more reliable estimate of the parameter value.

Once the grid is initialized, the system may wait for the vehicle to key on. At vehicle key on 306, the contactor may be turned on. Estimation may not be performed if the contactor is not turned on. The contactor may be checked to verify that the contactor is on 308. If the contactor is not requested to turn on, then the system may continue checking the contactor status 308. If the contactor is turned on, the system may begin the parameter estimation process 310.

The system may then measure the temperature of the battery pack. The controller may sample the temperature signal and store the result. The battery state of charge may also be evaluated. The state of charge may be calculated using ampere-hour integration. Ampere-hour integration may provide a reasonable estimate at initialization as this technique does not rely on the equivalent circuit parameter learning. In addition, the battery equivalent circuit parameters are less dependent on state of charge.

Knowing temperature and state of charge, the grid location for the current operating point may be ascertained. By comparing the temperature measurement to the elements of $T_{grid}$, the controller may find the index corresponding to the temperature measurement. Likewise, by comparing the state of charge value to the elements of $SOC_{grid}$, the controller may find the index corresponding to the current state of charge. The time stamp and quality of parameter estimation associated with the grid point (i,j) may then be read from $t_{stamp}(i,j)$ and QOPE(i,j) respectively 312.

The battery may age via power capability fade (through increasing of the internal resistance) and capacity loss (through loss of capabilities to hold ions in lithium-ion batteries). A calibration map (Timecal) may be defined to describe the resistance increase over time. The calibration map may indicate a series of times at which the battery parameters are expected to change. One method of obtaining the Timecal map may be to use a fixed interval that is dependent on the temperature and state of charge indices. Another method may be to use an adjustable time interval, that depends on temperature, state of charge, and the length of time the battery has been in operation. The adjustable time method may be derived from the observation that the battery aging (e.g., internal resistance change) occurs at a different rate over time. Battery power and capacity fade may occur faster in the earlier stages of battery life according to a root-square of time rule. The Timecal may be denoted as Timecal (i,j) and may be a function of battery use time, temperature, and state of charge. The Timecal value may be updated over time.

A projected quality of parameter may be calculated as $$ProjQOP(i,j)=QOPE(i,j)*e^{-\alpha*(t-tstamp(i,j))} \quad (37)$$

and a desired quality of parameter calibration may be expressed as $$QOPcal(i,j)=e^{-\alpha(t-TimeCal(i,j))} \quad (38)$$

where t is the current time and $\alpha$ is a parameter for representing gradual decay of the parameter estimation quality over time.

An exponential decay function is shown above but other functions may be used so long as it is monotonically decreasing over time. QOPcal may be calculated directly from Time-Cal and a so there is no need to store QOPcal as a map. The learned parameter has an associated quality index. As time elapses, the quality index decays. When determining whether to generate a new active excitation request, the projected quality index (ProjQOP) may be compared with a desired quality of parameter value (QOPcal) 314.

For example, consider the case in which the previously learned values, via active or passive excitation, for a given index (i,j) are the same. This indicates that the parameters at this index have not changed over time. In this case, the learning appears to have yielded a proper value. Active learning should not be requested too often. Such a learning sequence may be given a high QOPE which provides a larger ProjQOP and less opportunity to request active learning.

As another example, consider the case in which the previously learned values are significantly changed as measured by the standard deviation of the values. A low value of QOPE may be assigned to the learning sequence. A low QOPE provides a smaller ProjQOP which provides more opportunity to request active learning.

A request to perform active learning 316 may be initiated when ProjQOP(i,j)<QOPcal(i,j). When this comparison is true, a flag may be set to request active excitation such that the parameters may be learned during active excitation of the traction battery. Hysteresis may be added to prevent switching between states too quickly.

The projected QOPE value may start at a value defined by QOPE(i,j) and decay over time from that value. Likewise, the desired quality of parameter calibration may start at a value of one (when t=Timecal(i,j)) and decay over time from that value. Over time, the Timecal value may be reset based on temperature, state of charge or battery use time. When this occurs, the desired quality of parameter calibration may be reset to one making an active learning request more likely.

The system may operate so that a request to perform active excitation of the battery pack is based on the variability of previous parameter estimates and the time since the parameters were last estimated. As the variability of the parameters increases, the time between active excitation requests may decrease. In addition, based on the observation that parameters may change slower as the battery ages, the time between active excitation requests may increase as the age of the battery increases.

The time and time stamp values may be based on an overall controller global time. In other examples, the times may be based on a vehicle run time, battery contactor on-time, or battery throughput. The time stamp may represent the time that the parameter was updated.

Once active excitation is requested, a check may be made to determine if the parameter learning was indeed successful 318. Parameter learning may be checked using one or both of the persistent excitation condition and the estimation convergence condition. If the parameter learning was successful, parameter values may be retained for later use 320. The calculated QOPE and the associated time stamp may be written to memory or EEPROM for the associated grid point. The learned parameters may be stored in a database as $\theta_e(i,j,k)$, where (i,j) are the grid indices and k, an element of set [1,K], is a stack-like structure to store learned parameters sequentially. If less than K data points have been learned, QOPE(i,j) may be set to one. If there are K entries in the database and a new parameter is learned, the newly learned parameter may push the oldest data out of the set.

When K data values have been learned, the standard deviation of the K entries may be calculated. A map may be defined to calculate QOPE based on the standard deviation: QOPE(i,j)=f(standard deviation of the K values). If the standard deviation of the K entries is zero (i.e., values all the same) then QOPE may be assigned a maximum value which leads to a higher ProjQOP. If the standard deviation exceeds a predetermined threshold, the map may output a value less than one leading to a lower ProjQOP. As the standard deviation increases, the initial QOPE(i,j) may decrease.

Parameter estimates may be obtained using the model-based methods described above. The parameter estimates may be the result of passive or active excitation. Additional criteria for the parameter estimates such as persistent excitation or SIOF conditions may be checked. The scheme described attempts to decide when a new parameter estimate is needed for a given grid point based on the age and quality of the parameter estimate.

The above scheme may be used with other equivalent circuit models or parameterized electro-chemical models. The method of generating an active excitation may result in more accurate parameter estimates. The active parameter learning request may be based on the past update history of the parameters. Active learning may only be requested when needed based on the impact of the potential parameter error on the battery control signal estimations. The learning time may be determined based on battery properties and learning history data quality of estimation.

The above method may be implemented in one or more controllers as part of a powertrain control system or a vehicle power system. Active excitation may be requested based on variability of parameter estimates and the age of the most recent estimate. As parameter variability decreases, the time between active excitation requests may increase.

Performing Active Excitation

Prior art battery estimation may rely on voltage and current measurements obtained during normal battery operation. Normal battery operation may attempt to optimize fuel efficiency or minimize system losses. Such normal operation may not be optimal for estimating the battery parameters. The result may be that battery parameter estimates take longer to converge or that the battery parameter estimates are inaccurate. To improve parameter estimation, it is possible to excite the traction battery such that optimal conditions are present for parameter estimation.

A sufficient condition for accurate parameter estimation of the equivalent circuit model parameters is that the input signal contains at least one distinct frequency component for each two unknown parameters. These frequency components must have high signal-to-noise (SNR) in the input signal. The battery power demand profile must contain more than two distinct frequency components to achieve a quality estimation using the simplest model.

During vehicle operation, the persistent excitation conditions may not be satisfied or may only be weakly satisfied. One method to analyze the sufficiency of the battery power demand may be to analyze the frequency content of the battery power demand signal. In order to properly estimate the battery parameters, it may be desirable that the battery power demand vary over time. For example, during extended cruise control operation at a steady speed, the conditions may not be satisfied. During steady state speeds, the battery power demand may be at a nearly steady value. This constant value may not excite enough frequencies to allow for accurate estimation. The frequency component magnitudes may need to be above any noise signals to allow for identification of the parameters. During vehicle operations where the battery power demand is varied, the conditions are more likely to be satisfied. That is, the magnitude of the frequency components may be large enough to allow identification of the parameters. When the conditions are satisfied, the battery parameter estimation may be more accurate.

Inaccurate parameter estimation or infrequent update of the parameters may lead to inaccurate battery control values, such as state of charge and battery power capability, being calculated. For example, battery power capability may be incorrect which may impact battery durability and lifetime. Battery state of charge may be inaccurate which may impact vehicle system control and the energy management strategy. Fuel economy or energy efficiency during vehicle operation may be degraded.

An example of when persistent excitation criteria may not be satisfied is during generally constant battery power demands. This may occur during drive cycles in which a constant or steady speed is maintained. During a generally constant battery power demand, there may be little or no variation in the battery power that is supplied by the battery. When analyzed in the frequency domain, frequency component amplitudes for a given range of frequencies may be relatively low. In fact, if the power demand is constant there may only be a zero frequency amplitude.

As another example, consider a sinusoidal battery power demand that varies at a constant frequency at some magnitude. In this case, the frequency component amplitude at the constant frequency may be greater than the amplitude found at other frequencies. When plotting amplitude versus frequency a spike at the constant frequency may be observed. As additional frequency components are added to the battery power demand the amplitude values at the different frequencies will increase.

As discussed above, the control system may passively perform parameter estimation by waiting for the conditions to be satisfied. Alternatively, a request to actively control the battery power demand to satisfy the conditions may be initiated. The control strategy for actively modifying the battery power demand may require several functions. A battery system state monitoring function may determine when to generate an active system excitation request. A battery system excitation input signal pattern recognition function may determine the battery power input format and frequency components. A battery system excitation output function may issue commands to realize the desired battery system input.

The format of the battery power demand signal may need to be determined. In general, a battery power demand signal may be selected that forms a certain predefined pattern for a short time period with a number of distinct and dominating frequency components n>N/2, where N is the total number of system parameters to be identified. This condition may be considered to be the frequency domain equivalent of the persistent excitation condition described previously. In practice, the shape of the excitation input pattern must be specified such that the resulting battery power demand has significant magnitude, but constrained with the battery power limits. Without a loss of generality, a candidate signal, $P_{batt\_atv}$, may be generated as:

$$P_{batt\_atv} = \Sigma_{i=1}^{n} A_i \sin(\omega_i + \phi_i) \tag{39}$$

where $\omega$ and $\phi$ are the angular frequency and phase of the i-th frequency component and $A_i$ is the magnitude of the i-th component. In addition, the active battery power pattern should comply with battery SOC conservation requirements.

During periods of generally constant battery power demand, when viewed in the frequency domain, a range of frequency component amplitudes of battery power demand may be less than a predefined magnitude. Active excitation causes a predetermined number of the frequency component amplitudes to exceed the predefined magnitude by modifying the battery power demand. The specific range and predefined magnitude may be dependent upon the particular battery impedance parameters.

In an electrified vehicle, the battery power demand, $P_{batt}$, to satisfy a given driver power demand, $P_{whl}$, may be determined as follows:

$$P_{eng} + P_{batt} - P_{loss} - P_{acc} = P_{whl} \tag{40}$$

$$P_{drv} = P_{whl} - P_{brk} - P_{load} \tag{41}$$

where $P_{eng}$ is engine power, $P_{batt}$ is battery power, $P_{loss}$ is the powertrain power loss, $P_{acc}$ is the accessory power load, $P_{whl}$ is the propulsion wheel power, $P_{drv}$ is the driver demand, $P_{brk}$ is the braking wheel power, and $P_{load}$ is the external power loads. Under driving conditions, $P_{whl}$ must satisfy the driver demand.

One possible method of altering the battery power demand is to adjust the power demand allocation in the vehicle system control domain. The overall power distribution may be distributed between the engine and the battery by controlling a power distribution between an engine power output and an electric machine power output. The desired battery power demand may be generated at a given wheel power demand level as:

$$P_{batt} = P_{whl} + P_{loss} + P_{acc} - P_{eng} = P_{batt\_atv} \tag{42}$$

When setting the battery power to the candidate signal, the engine power may be adjusted to compensate as follows:

$$P_{eng} = P_{batt\_atv} + P_{whl} + P_{loss} + P_{acc} \tag{43}$$

Figure 7:
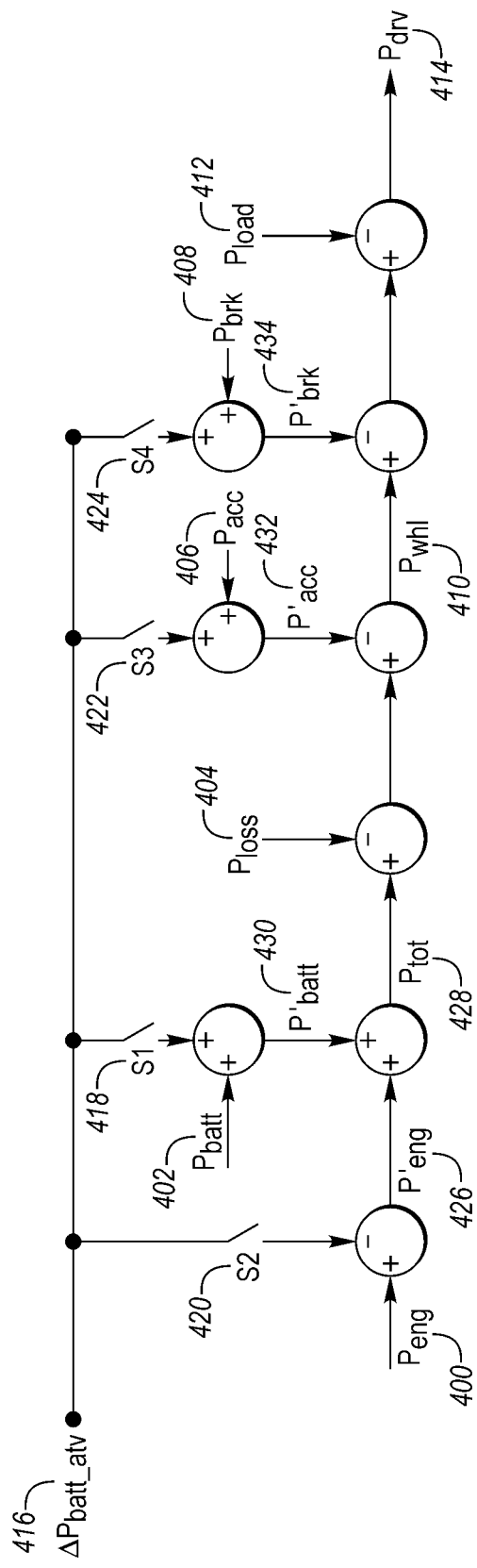
FIG. 7 is a diagram depicting possible power flows for describing active excitation of the traction battery.

FIG. 7 shows a power flow diagram for the system depicting the above equations. When considering normal power distribution between the battery and engine, the switches (418, 420, 422, 424) may be considered open. The system may calculate an engine power ($P_{eng}$) 400 and a battery power ($P_{batt}$) 402 to meet specified performance objectives such as system efficiency while meeting the overall driver demand ($P_{drv}$) 414. The total power supplied by the engine and battery ($P_{tot}$) 428 is the sum of the engine and battery powers. Note that battery electrical power may be converted to mechanical power by an electric machine. Power is required to account for losses ($P_{loss}$) 404 and accessory power consumption ($P_{acc}$) 406. A power at the wheel is determined ($P_{whl}$) 410 based on the power supplied by the battery and engine minus these losses and accessory loads. The power output from the drivetrain ($P_{drv}$) 414 is the power delivered to the wheel 410 minus any braking power ($P_{brk}$) 1408 and minus any vehicle load ($P_{load}$) 412.

$P_{whl}$ 410 may be a total power from the engine and electric machines delivered to the wheels of the vehicle. The wheel power reflects the torque applied at the wheel which is a function of the engine torque and the electric machine torque. The losses, $P_{loss}$ 404, may be powertrain losses that include transmission efficiencies and rotating losses. These losses may also include electric machine and power electronics efficiencies and losses.

During active excitation, the battery power demand may be set to a pattern that sufficiently excites the system so that parameter estimation accuracy may be improved. The engine power should not be permitted to violate any engine power limits and abrupt changes in engine speed or torque may be limited. The total power from the engine and battery may remain the same, the distribution of the power provided between the two may be altered to provide sufficient excitation for battery parameter estimation. When more battery power is provided, less engine power is needed.

An adjustment to battery power is depicted in FIG. 7 as an active excitation power addition $\Delta P_{batt\_atv}$ 416. The additional battery power may be a positive or negative quantity that makes $P_{batt}$ equal to $P_{batt\_atv}$ as discussed above. When using the engine to offset the battery power addition, any increase in battery power supplied may lead to a decrease in engine power supplied. Any decrease in battery power supplied may lead to an increase in engine power supplied. In this mode of active excitation, switches S1 (418) and S2 (420) may be closed. The additional power $\Delta P_{batt\_atv}$ 416 may be added to $P_{batt}$ (402) to give an adjusted battery power $P'_{batt}$ 430. The additional power $\Delta P_{batt\_atv}$ 416 may be subtracted from the engine power $P_{eng}$ 400 to give an adjusted engine power $P'_{eng}$ 426. In this mode, the total power output $P_{tot}$ 428 may be the same as before (that is, without the addition of $\Delta P_{batt\_atv}$ 416). This mode merely adjusts the relative power contribution between the engine and the battery.

Another possible method of altering the battery power demand may be to alter the accessory power, $P_{acc}$. This may be achieved by controlling power consumed by an electrical load. The above equations apply except that engine power is not changed, but an accessory load power may be changed. The resulting equation is:

$$P_{acc} = P_{eng} + P_{batt\_atv} - P_{whl} - P_{loss} \quad (44)$$

In this case, as more battery power is provided, the accessory load is operated to use the additional battery power.

This method may be analyzed from FIG. 7 by closing switch S1 (418) and switch S3 (422). Battery power may be adjusted by $\Delta P_{batt\_atv}$ 416 to yield an adjusted battery power $P'_{batt}$ 430. The accessory power $P_{acc}$ 406 may be incremented by $\Delta P_{batt\_atv}$ 416 as well to yield $P'_{acc}$ 432. In this mode, the additional power is drawn from the battery to supply an increased demand from the accessory loads. Modifying the accessory load may require close coordination with associated controllers to increase a power demand for accessory load.

Another possible method of altering the battery power demand may be through wheel torque cancellation. Torque cancellation applies an active brake torque to boost the propulsion wheel torque above the normal drive power demand plus load torque level. The effect may be achieved by controlling an electric machine power output and operating a wheel brake to offset the changes in the electric machine power output. As $P_{brk}$ is increased, $P_{whl}$ may be increased to compensate. The increase in $P_{whl}$ may be accomplished with additional battery power, $P_{batt}$. In this manner, $P_{brk}$ and $P_{batt}$ may be altered using $P_{batt\_atv}$ to achieve the desired battery power demand excitation.

This method may be analyzed from FIG. 7 by closing switch S1 418 and switch S4 424. Battery power may be adjusted by $\Delta P_{batt\_atv}$ 416 to yield an adjusted battery power $P'_{batt}$ 430. The brake power $P_{brk}$ 408 may be incremented by $\Delta P_{batt\_atv}$ 416 as well to yield $P'_{brk}$ 434. In this mode, the power absorbed by the braking system may be supplied by the battery.

Wheel torque cancellation may require close coordination with the braking system to apply a braking force to the wheels. Additionally, coordination with the battery controller and power electronics module may be necessary. The power electronics module may be required to change the mechanical power output of an electric machine to supply the extra power absorbed by the brakes.

In all of the cases described, the power delivered $P_{drv}$ 414 remains the same. The vehicle and powertrain delivers and absorbs power in such a manner as to be transparent to the vehicle operator. Any additional power added into the drivetrain may be absorbed by other components such that the output power remains constant. Since the power at the wheel for propulsion remains the same in each case, the traction battery excitation does not affect the vehicle acceleration. The system described creates a condition for improved battery excitation without affecting acceleration of the vehicle.

Note that in FIG. 7, the switches are merely illustrative of how the system is intended to operate. In practice, the logic may be implemented in the controller and no physical switches are necessary.

There are several situations in which active battery power excitation may be useful. One situation may be during cold start conditions. The battery system may be equipped with a temperature control system to maintain the battery operation within a certain temperature range. Under cold start conditions it may be desired to accurately estimate the battery parameters. To guarantee that the parameters may be accurately learned, the active excitation scheme may be initiated.

The battery system parameter values are also dependent on the battery SOC. At certain SOC levels, the battery parameters may not be learned unless the system estimation conditions are satisfied. They may be observed in PHEV and BEV as the battery depletes from a high SOC to a low SOC during vehicle operation. At certain SOC levels, the active excitation may be initiated to allow accurate parameter estimation. Accurate knowledge of the battery parameters is important for battery system protection and durability. In addition, accurate knowledge of the parameters helps to achieve consistent performance and fuel economy.

The active excitation system described may find most usage during periods of generally constant battery power demand. During a period of generally constant battery power demand, the frequency component amplitudes over a given range may be less than some threshold. This may indicate that the persistent excitation criteria may not be satisfied. When a condition is identified in which active excitation is needed, the battery power demand may be adjusted in order to cause the desired number of frequency component amplitudes to exceed a threshold value. The range of frequencies and the magnitude of the frequency component amplitudes may be based on expected battery impedance parameters. The active excitation system may then operate various vehicle systems to achieve the desired battery power demand without affecting acceleration of the vehicle.

The active excitation may be implemented as part of a powertrain control system for a vehicle. The system described may require coordination between multiple systems or controllers. An electrical load may need to be controlled and may have an associated controller. The electric machine power may need to be controlled and may have an associated controller. The engine may require operational changes as well. The controllers may communicate via a network to coordinate operations. A coordinating controller that implements the algorithm may be part of a powertrain control system and may communicate with the other controllers to achieve the desired operation.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A battery control system comprising:
a traction battery including a plurality of cells; and
at least one controller programmed to generate model parameter estimates for the cells and, in response to a magnitude of a state of charge difference between cells being greater than a predetermined value while a persistent excitation condition and an estimation convergence condition are satisfied, balance the cells according to states of charge derived from the model parameter estimates.

2. The battery control system of claim 1 wherein the persistent excitation condition is satisfied when $$\alpha_0 I \geq \frac{1}{T_{pe}} * \int_{t_0}^{t_0+T_{pe}} \left[\frac{d(V_t(\tau) - V_{oc}(\tau))}{d\tau} i(\tau) \frac{di(\tau)}{d\tau}\right]^T * \left[\frac{d(V_t(\tau) - V_{oc}(\tau))}{d\tau} i(\tau) \frac{di(\tau)}{d\tau}\right] d\tau \geq \alpha_1 I$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values.

3. The battery control system of claim 1 wherein the estimation convergence condition is satisfied when an error magnitude between at least one of the model parameter estimates and a corresponding measured model parameter value is less than a predetermined threshold for a predetermined period of time.

4. The battery control system of claim 1 wherein the at least one controller is further programmed to, in response to at least one of the persistent excitation condition and the estimation convergence condition not being satisfied, cause a predetermined number of frequency component amplitudes of battery power demand to exceed a predetermined magnitude without affecting vehicle acceleration.

5. A vehicle comprising:
a traction battery including a plurality of cells; and
at least one controller programmed to, in response to a magnitude of a state of charge difference between cells being greater than a predetermined value while a persistent excitation condition and an estimation convergence condition are satisfied, balance the cells according to states of charge derived from estimated cell model parameters.

6. The vehicle of claim 5 wherein the persistent excitation condition is satisfied when $$\alpha_0 I \geq \frac{1}{T_{pe}} * \int_{t_0}^{t_0+T_{pe}} \left[\frac{d(V_t(\tau) - V_{oc}(\tau))}{d\tau} i(\tau) \frac{di(\tau)}{d\tau}\right]^T * \left[\frac{d(V_t(\tau) - V_{oc}(\tau))}{d\tau} i(\tau) \frac{di(\tau)}{d\tau}\right] d\tau \geq \alpha_1 I$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values.

7. The vehicle of claim 5 wherein the estimation convergence condition is satisfied when an error magnitude between at least one estimated traction battery parameter and a corresponding measured traction battery parameter value is less than a predetermined threshold for a predetermined period of time.

8. The vehicle of claim 5 wherein the at least one controller is further programmed to, in response to the magnitude of the state of charge difference between cells being less than the predetermined value, terminate balancing the cells.

9. The vehicle of claim 5 wherein the at least one controller is further programmed to, in response to the magnitude of the state of charge difference between cells being less than the predetermined value while the persistent excitation condition and the estimation convergence condition are satisfied during cell balancing, terminate balancing the cells.

10. The vehicle of claim 5 wherein the at least one controller is further programmed to, in response to the persistent excitation condition and the estimation convergence condition not being satisfied for a predetermined period of time after starting cell balancing, cause a predetermined number of frequency component amplitudes of battery power demand to exceed a predetermined magnitude without affecting acceleration of the vehicle.

11. The vehicle of claim 5 wherein the at least one controller is further programmed to balance the cells at a scheduled time in response to the magnitude of the state of charge difference between the cells being greater than the predetermined value while the persistent excitation condition and the estimation convergence condition are satisfied at the scheduled time.

12. The vehicle of claim 11 wherein the at least one controller is further programmed to, in response to the persistent excitation condition and the estimation convergence condition not being satisfied at the scheduled time, cause a predetermined number of frequency component amplitudes of battery power demand to exceed a predetermined magnitude without affecting acceleration of the vehicle.

13. A method of balancing cells of a traction battery by at least one controller comprising:
initiating, after learning a first set of states of charge for the cells in response to a persistent excitation condition and an estimation convergence condition being satisfied, cell balancing based on first state of charge differences between the cells having a magnitude greater than a predetermined value; and
terminating, after learning a second set of states of charge for the cells in response to the persistent excitation condition and the estimation convergence condition being satisfied, cell balancing based on second state of charge differences between the cells having a magnitude less than the predetermined value.

14. The method of claim 13 wherein the persistent excitation condition is satisfied when $$\alpha_0 I \geq \frac{1}{T_{pe}} * \int_{t_0}^{t_0+T_{pe}} \left[ \frac{d(V_t(\tau) - V_{oc}(\tau))}{d\tau} i(\tau) \frac{di(\tau)}{d\tau} \right]^T * \left[ \frac{d(V_t(\tau) - V_{oc}(\tau))}{d\tau} i(\tau) \frac{di(\tau)}{d\tau} \right] d\tau \geq \alpha_1 I$$

is satisfied, where $T_{pe}$ is an integration interval, $V_t$ is a terminal voltage, $V_{oc}$ is an open circuit voltage, i is a current, and $\alpha_0$ and $\alpha_1$ are predetermined values.

15. The method of claim 13 wherein the estimation convergence condition is satisfied when an error magnitude between an estimated model parameter and a corresponding measured model parameter value is less than a predetermined threshold for a predetermined period of time.

16. The method of claim 13 further comprising permitting cell balancing to be initiated at a predetermined time.

17. The method of claim 16 further comprising causing a predetermined number of frequency component amplitudes of battery power demand to exceed a predetermined magnitude without affecting vehicle acceleration in response to the persistent excitation condition and the estimation convergence condition not being satisfied within a predetermined time interval before the predetermined time.

18. The method of claim 13 further comprising causing a predetermined number of frequency component amplitudes of battery power demand to exceed a predetermined magnitude without affecting vehicle acceleration in response to cell balancing not terminating a predetermined amount of time after being initiated.

19. The method of claim 13 further comprising limiting a number of cell balancing cycles within a single ignition cycle to be less than a predetermined number of cycles.

* * * * *